United States Patent [19]
Yang et al.

[11] Patent Number: 5,563,424
[45] Date of Patent: Oct. 8, 1996

[54] POLYMER GRID TRIODES

[75] Inventors: Yang Yang; Alan J. Heeger, both of Santa Barbara, Calif.

[73] Assignee: Uniax Corporation, Santa Barbara, Calif.

[21] Appl. No.: 292,817

[22] Filed: Aug. 10, 1994

Related U.S. Application Data

[63] Continuation-in-part of Ser. No. 218,321, Mar. 24, 1994, abandoned, and Ser. No. 227,979, Apr. 15, 1994, abandoned.

[51] Int. Cl.$^6$ .......................... H01L 35/24; H01L 51/00; H01L 29/06
[52] U.S. Cl. .......................... 257/40; 257/103; 257/613; 252/500
[58] Field of Search ................... 257/1, 40, 103, 257/613; 252/500

[56] References Cited

U.S. PATENT DOCUMENTS

| | | | |
|---|---|---|---|
| 4,750,816 | 6/1988 | Ito et al. | 350/357 |
| 4,769,292 | 9/1988 | Tang et al. | 428/690 |
| 5,189,136 | 2/1993 | Wudl et al. | 528/86 |
| 5,232,631 | 8/1993 | Cao et al. | 252/500 |
| 5,282,955 | 2/1994 | Leventis et al. | 205/317 |

OTHER PUBLICATIONS

Bozler C. O. "Current prospects for the permeable base transistor" *Surface Science* (1986) 174:487–500.
Tang et al. "Organic electroluminescent diodes" *Appl. Phys. Lett.* (1987) 51:913–915.
Tang et al. "Electroluminescence of doped organic thin films" *J. Appl. Phys.* (1989) 65:3610–3616.
Adachi et al. "Organic electroluminescent device having a hole conductor as an emitting layer" *Appl. Phys. Lett.* (1989) 55:1489–1491.
Nohara et al. "A new series of electroluminescent organic compounds" *Chemistry Letters* (1990) pp. 189–190.
Adachi et al. "Blue light-emitting organic electroluminescent devices" *Appl. Phys. Lett.* (1990) 56:799–801.
Mohammadi et al. "Conducting polymers prepared by template polymerization: polypyrrole" *Polymer* (1990) 31:395–399.
Burroughes et al. "Light-emitting diodes based on conjugated polymers" *Nature* (1990) 347:539–541.
Braun et al. "Visible light emission from semiconducting polymer diodes" *Appl. Phys. Lett.* (1991) 58:1982–1984.
Cao et al. "Counter-ion induced processibility of conducting polyaniline and of conducting polyblends of polyaniline in bulk polymers" *Synthetic Metals* (1992) 48:91–97.
Cao et al. "Solution-cast films of polyaniline: Optical-quality transparent electrodes" *Appl. Phys. Lett.* (1992) 60:2711–2713.
Gustafsson et al. "Flexible light-emitting diodes made from soluble conducting polymers" *Nature* (1992) 357:477–479.
Yang et al. "Morphology of conductive, solution-processed blends of polyaniline and poly(methyl methacrylate)" *Synthetic Metals* (1993) 53:293–301.
Aratani et al. "Improved efficiency in polymer light-emitting diodes using air-stable electrodes" *Journal of Electronic Materials* (1993) 22:745–749.
Zhang et al. "Light-emitting diodes from partially conjugated poly(p—phenylene vinylene)" *J. Appl. Phys.* (1993) 73:5177–5180.

(List continued on next page.)

*Primary Examiner*—Sara W. Crane
*Attorney, Agent, or Firm*—Burns, Doane, Swecker & Mathis, L.L.P.

[57] ABSTRACT

Polymer grids comprising a body of electrically conducting organic polymer, which body has an open and porous network morphology and defines an expanded surface area void-defining porous network are disclosed. In most applications active electronic material is located within at least a portion of the void spaces defined by the porous network. These grids are advantageously incorporated into polymer grid triodes and especially light-emitting polymer grid triodes.

119 Claims, 12 Drawing Sheet

OTHER PUBLICATIONS

Reghu et al. "Superlocalization of the Electronic Wave Functions in Conductive Polymer Blends at Concentrations near the Percolation Threshold" *Macromolecules* (1993) 26:7245–7249.

Greenham et al. "Efficient light–emitting diodes based on polymers with high electron affinities" *Nature* (1993) 365:628–630.

Zhang et al. "Blue electroluminescent diodes utilizing blends of poly(p–phenylphenylene vinylene) in Poly(9–vinylcarbazole)" *Synthetic Metals* (1994) 62:35–40.

Parker I. D. "Carrier tunneling and device characteristics in polymer light–emitting diodes" *J. of Appl. Phys.* (1994) 75:1656–1666.

Yang et al. "Polyaniline as a transparent electrode for polymer light–emitting diodes: Lower operating voltage and higher efficiency" *Appl. Phys. Lett.* (1994) 64:1245–1247.

POLYMER GRID TRIODES

REFERENCE TO RELATED APPLICATION

This application is a continuation-in-part of U.S. patent application Ser. No. 08/218,321 filed on Mar. 24, 1994 and the continuation-in-part to that application filed on Apr. 15, 1994 (Ser. No. 08/227,979) both now abandoned. Those applications are incorporated by reference.

FIELD OF THE INVENTION

This invention relates generally to polymer grids, to methods for fabricating such polymer grids and to uses for such polymer grids in electronic devices such as polymer grid triodes and light-emitting polymer grid triode structures.

BACKGROUND OF THE INVENTION

Prior to the invention of the transistor, vacuum tube triodes were the principal three-terminal devices used in active electronic circuits. The vacuum tube triode comprises three electrodes:

(i) A cathode where electrons are emitted by thermionic emission;

(ii) An anode where the electrons are collected;

(iii) An open grid placed in the vacuum tube between the cathode and the anode. Typically a voltage is applied between the anode and the cathode with the anode positive with respect to the cathode such that current flows from anode to cathode (electrons flow from cathode to anode). A bias voltage is applied to the grid with respect to the cathode; typically a high impedance voltage source is used so that the grid does not draw significant current. In this way, a relatively small grid-cathode voltage can be used to control the current between the cathode and the anode, a key feature in the use of such triodes in amplifier circuits, oscillator circuits, control circuits and the like.

The transistor, in its various forms, is also a three-terminal device; a solid state analogue of the triode. The transistor does not utilize a grid to control the current in the external circuit; such control is obtained by other means. For example, in a field effect transistor (FET), the source-drain current is controlled by the gate voltage; application of a gate voltage creates carriers in the source-to-drain channel and renders the channel conducting. Thus, an FET is an active three-terminal device, the gate voltage controls the source-drain current. An npn transistor is, fundamentally, two pn junction diodes back-to-back. Again, an npn transistor is a three-terminal device; by controlling the bias of the two diodes independently through contact to the center p-type layer, one can control the current between the two n-type layers and thereby achieve gain (S. M. Sze, *Physics of Semiconductor Devices* (Wiley, N.Y., 1981)).

In the FET, as well as in transistors in other forms, the frequency response is limited by the size of the device. For example, FETs with large source-to-drain spacing will be slow relative to FETs with a smaller source-to-drain spacing. The response is limited by the time required for the carriers to travel from source to drain. Thus, modern semiconductor technology strives for the following:

(a) Ever smaller devices, for example with sub-micron resolution, thereby achieving more circuits per unit area and higher frequency response;

(b) Higher mobility materials so as to reduce the time required for the carriers to travel from source to drain.

It is well known that there is considerable cost and technical difficulty involved in the fabrication of such sub-micron transistors and arrays of such transistors (integrated circuits) using high mobility single crystal materials.

The semiconductor on-chip technology that is the heart of modern electronics is not appropriate to certain important electronic applications. An example is the Active Matrix Liquid Crystal Display. In order to achieve the desired contrast in a liquid crystal display, it is desirable to have each pixel of the display is controlled by a transistor. In the Active Matrix Liquid Crystal Display, it is advantageous to fabricate these control transistors as thin film transistors on a surface which is an integral part of the display. The technology is limited by poor yields, high costs and poor high frequency response (low speed operation), all of which result from the need to use conventional transistor design with the low mobility materials amenable to thin film deposition on surfaces (for example, amorphous silicon, organic semiconductors and the like).

Thus, there is a need for improved low cost three-terminal solid state devices, analogous to the vacuum tube triode and to the transistor, which can be easily manufactured, and which utilize low mobility materials in a configuration where the cathode to anode distances are submicron.

There is also a need for new concepts in the area of electroluminescent devices. Recently, light-emitting diodes (LEDs) fabricated with conducting polymers (H. Burroughes, D. D. C. Bradley, A. R. Brown, R. N. Marks, K. Mackay, R. H. Friend, P. L. Burns and A. B. Holmes, Nature 347, 539 (1990); D. Braun and A. J. Heeger, Appl. Phys. Lett. 58, 1982 (1991)) have attracted attention due to their potential for use in display technology. Such LED's are layered structures with two electrodes separated by charge transporting and luminescent layers. Among the promising materials for use in polymer LEDs are poly(2-methoxy-5-(2'-ethyl-hexyloxy)-1,4-phenylene vinylene), MEH-PPV, a semiconducting polymer with energy gap $E_g \sim 2.1$ eV (U.S. Pat. No. 5,189,136) and poly(2,5-bis(cholestanoxy)-1,4-phenylene vinylene) (BCHA-PPV), a semiconducting polymer with energy gap $E_g \sim 2.2$ eV (C.i.P. of U.S. Pat. No. 5,189,136, filed Mar. 8, 1993). Both MEH-PPV and BCHA-PPV are soluble in common organic solvents, thereby enabling relatively simple device fabrication by processing the active layer from solution. In the polymer LEDs the semiconducting polymer is sandwiched between two electrodes; a low-work function metal (such as Ca, Al, and the like); and a transparent electrode, such as indium/tin oxide (ITO) (D. Braun and A. J. Heeger, Appl. Phys. Lett. 58, 1982 (1991)). By using a conducting polymer, such as polyaniline (PANI) (rather than indium/tin-oxide, ITO) as the hole-injecting contact, robust and mechanically flexible LEDs have been prepared (G. Gustafsson, Y. Cao, G. M. Treacy, F. Klavetter, N. Colaneri, and A. J. Heeger Nature, 357, 477 (1992)).

Electroluminescent (EL) devices utilizing small organic molecules as the luminescent semiconducting species were well known and extensively developed prior to the discovery of light-emitting diodes made with conjugated polymers. See, for example, the following: C. W. Tang, S. A. Van Syke, Appl. Phys. Lett. 51, 913 (1987); C. W. Tang, S. A. Van Syke and C. H. Chen, J. Appl. Phys. 65, 3610 (1989); C. Adachi, S. Tokito, T. Tetsui and S. Saito, Appl. Phys. Lett. 55, 1489 (1989); C. Adachi, S. Tokito, T. Tetsui and S. Saito, Appl. Phys. Lett. 56, 799 (1989); M. Nohara, M. Hasegawa, C. Hosohawa, H. Tokailin, T. Kusomoto, Chem. Lett. 189

(1990). In the small molecule EL devices of the prior art, the active layers are typically deposited using vacuum deposition. Transport layers (both electron transport layers and hole transport layers) were developed to improve the carrier injection and to balance the injection of electrons and holes so as to achieve higher efficiency.

Unfortunately, EL devices made with organic and/or polymeric materials as the semiconducting and luminescent materials suffer three important drawbacks that impede large-scale applications:

i) Emission of light at the desired brightness levels often requires the application of a relatively high voltage.

ii) The external conversion efficiency is low.

iii) Brightness is limited, particularly at voltages below 5 volts.

Recent progress has shown that by generalizing to heterojunction devices which include an electron transport layer, device efficiency can be somewhat improved in polymer LEDs using, for example, BCHA-PPV (C. Zhang, S. Hoger, K. Pakbaz, F. Wudl and A. J. Heeger, J. Electron. Mater. 22, 745 (1993)) or using a soluble cyano-derivative of poly(phenylene vinylene), PPV (N.C. Greenham, S. C. Moratti, D. D. C. Bradley, R. H. Friend, A. B. Holmes, Nature, 365, 628 (1993)).

Nevertheless, general and broad needs still exist for device concepts that result in light-emitting structures with increased efficiency, decreased turn-on voltage, and increased brightness.

SUMMARY OF THE INVENTION

We have now discovered a polymer grid which can be advantageously incorporated into electronic devices as either an active or passive element. This polymer grid is made up of a body of electrically conducting organic polymer. This body has an open and porous network morphology and defines an expanded surface area void-defining porous network. In certain embodiments an active electronic material is located within at least a portion of the void spaces defined by the porous network.

This polymer grid may be incorporated into electronic devices where the grid, as an active or passive element, can affect the transport of electrons or holes through the material of the device. The polymer grid has been shown to affect electronic performance and light emission both in the case where the grid is an "active" element connected to an external circuit and in the case where it is a "passive" element not specifically connected to an external circuit.

Thus, by the use of this grid one can achieve polymer grid triodes comprising three electrodes. The first and second electrodes in either order, are analogous to the anode and/or cathode of the vacuum tube triode. The polymer grid, either as a passive element or electrically connected to serve as a true third electrode, is located between the first two electrodes and is analogous to the grid electrode of the vacuum tube triode.

One or more active electronic materials may be placed between the first electrode and the polymer grid, within the polymer grid, or between the polymer grid and the second electrode. Charge carriers are injected from the electrodes into the active electronic materials. This charge carrier injection may be either single-carrier injection (for example, hole injection into otherwise filled energy states) at one electrode or two-carrier injection (hole injection into otherwise filled energy states at one electrode and electron injection into otherwise empty states at higher energy at a second electrode).

The active materials serve to transport the electronic charge carriers, the carriers being affected, and in some embodiments controlled, by the polymer grid. The active electronic materials, which transport electronic charge carriers between the first and second electrodes are conductors with various levels of electrical conductivity, one or more of which can be, for example, semiconductor materials.

In an additional aspect the polymer grid may be incorporated into light-emitting devices to provide light-emitting polymer grid triodes comprising three electrodes. In these triodes one or more of the active materials which are present and serve to transport the electronic charge carriers are semiconducting and luminescent materials, thereby leading to radiative recombination of electrons and holes and the emission of light. In these devices the transport of carriers and thus the emitted light can be controlled and affected by the polymer grid.

As previously noted, the polymer grid may be an active (that is electrically connected) or passive element of these devices. As a passive element, the grid can increase the efficiency of devices dramatically. Although not understood with certainty, it appears that the polymer grid's high surface area network enhances the local electric field upon the application of a voltage between the first and second electrodes, resulting in enhanced charge carrier injection into one or more of the active electronic materials. In the case of light-emitting devices, the polymer grid enhances the local electric field sufficiently that on applying a voltage between the first and second electrode, charge carriers are injected and light is emitted.

In another embodiment, the polymer grid is electrically connected so as to provide a third electrode of a "triode" configured device In this case the polymer grid is electrically connected to an external circuit such that a voltage can be applied to the polymer grid as an electrode, and current can be drawn in the grid circuit, either positive or negative, between the polymer grid electrode and one of the other two electrodes so as to function as a three-terminal polymer grid triode.

It is additionally an aspect of the present invention to provide light-emitting polymer grid triodes with two-carrier charge injection in which the polymer grid electrode is electrically connected to an external circuit such that a voltage can be applied to the polymer grid electrode and current can be drawn in the grid circuit, either positive or negative, between the polymer grid electrode and one of the other two electrodes so as to function as a three-terminal light-emitting polymer grid triode.

It is an additional aspect of the present invention to provide two-carrier polymer grid triodes. In these devices the electron and hole currents can be controlled and balanced by biasing the polymer grid electrode or by including two or more independent polymer grid electrodes, separated by an active layer, that can be separately biased with respect to the anode and the cathode, respectively.

It is an additional aspect of the present invention to provide polymer grid triodes and light-emitting polymer grid triodes in which the various layers are thin films. With such configurations, the total distance between the first and second electrodes is set by the thickness of the films in a vertical configuration. This makes possible polymer grid triodes and light-emitting polymer grid triodes with sub-micron dimensions between the anode and cathode.

In a further aspect this invention provides processes for forming the polymer grids. In these methods, blends are formed of the conductive organic polymer which makes up the polymer grid with a sacrificial host polymer. The two polymers exist in the blend as bicontinuous interpenetrating phases. When the host polymer is removed, such as by sublimation, dissolving, or the like, the desired polymer grid is formed. Active material may be placed in the voids of the grid as the host polymer is being removed or thereafter.

BRIEF DESCRIPTION OF FIGURES

This invention will be fur described with reference being made to the accompanying drawings in which the figures show the following:

FIG. 26 shows the anode (A)—cathode (C) current vs voltage ($I_{AC}$ vs $V_{AC}$) curves for different voltages ($V_G$) between the cathode and the polymer grid electrode.

FIG. 27 shows the light emitted from the polymer grid triode as a function of the anode-to-cathode voltage ($V_{AC}$) for several different grid-anode bias voltages ($V_G$).

FIG. 28 shows the light emitted at constant $V_{AC}$ (for $V_{AC}$=2 V, 5 V, and 6 V) as a function of $V_G$.

current vs voltage ($I_{AC}$ vs $V_{AC}$) curves for different voltages ($V_G$) between the anode and the polymer grid electrode in the polymer grid triode of Example 14.

Figure 32:
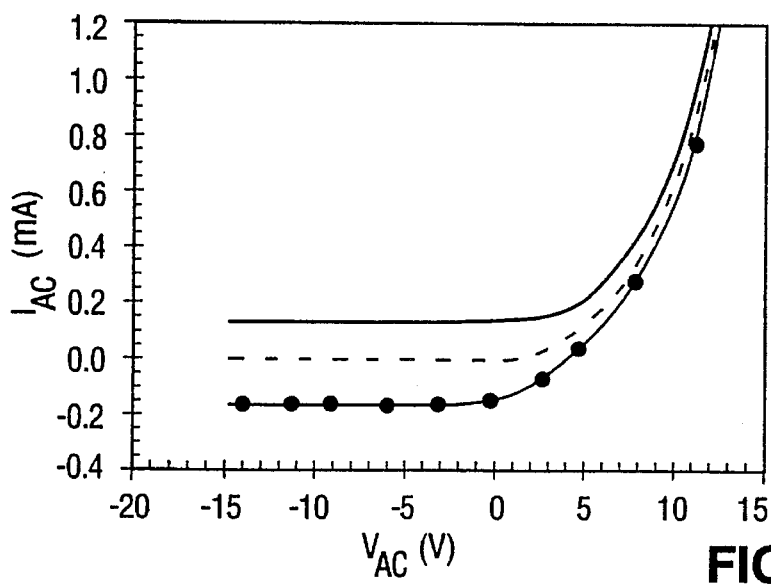

FIG. 32 is a series of graphs also based on data gathered in Example 14 which shows the anode (A)—cathode (C) current vs voltage ($I_{AC}$ vs $V_{AC}$) curves for different voltages ($V_G$) between the anode and an altered polymer grid electrode in which the host polymer has not been removed.

Figure 33:
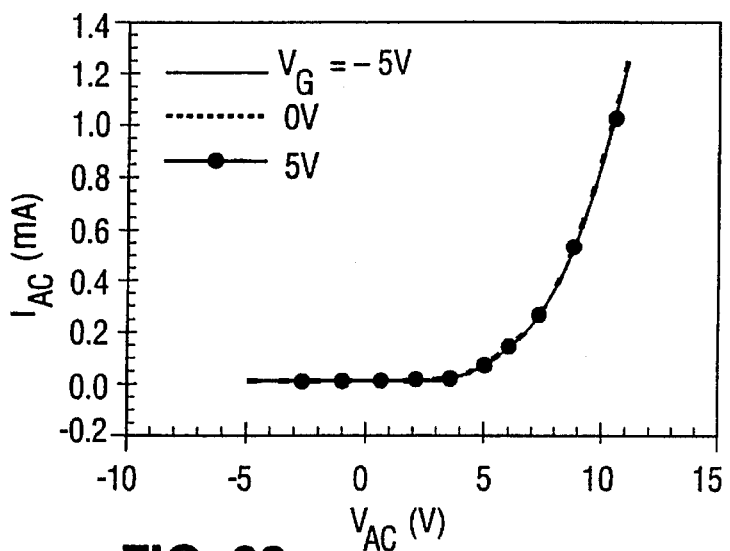

FIG. 33 is a graph showing a $I_{AC}$ vs $V_{AC}$ curve for the light-emitting polymer grid triode of Example 15.

Figure 34:
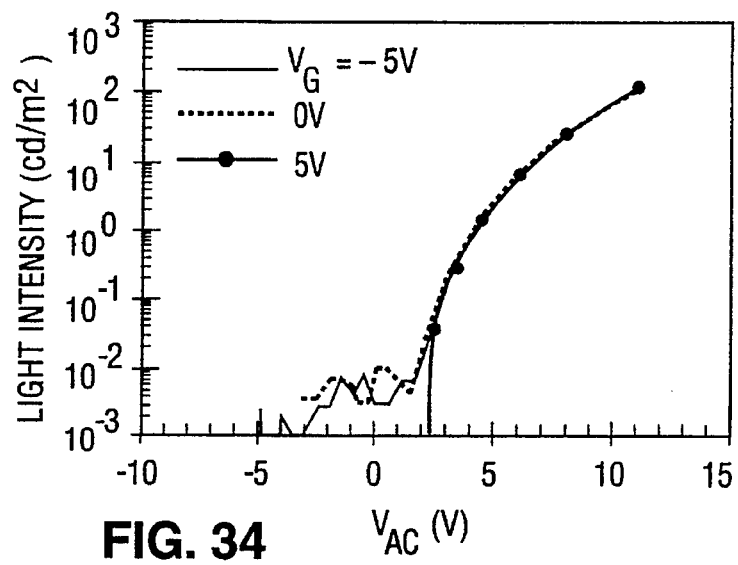

FIG. 34 is a graph that shows the light emitted from the polymer grid triode of Example 15 as a function of the anode-to-cathode voltage ($V_{AC}$) for several different grid-anode bias voltages ($V_G$).

Figure 35:
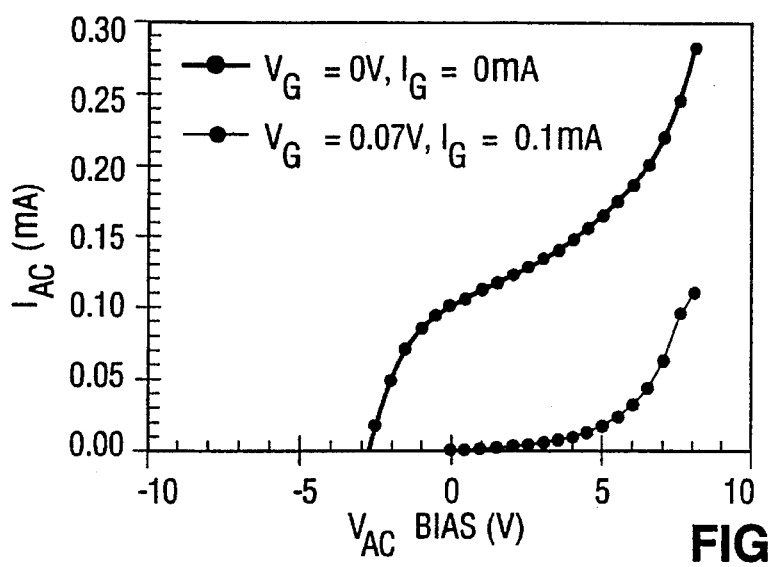

FIG. 35 is a pair of graphs based on data generated in Example 16. $I_{AC}$ vs $V_{AC}$ curves are plotted at $V_G=0$ (zero grid current) and at $V_G=0.07$ V with $I_G=0.1$ mA to show the effect of the grid current on $I_{AC}$ at various $V_{AC}$ bias levels.

Figure 36:
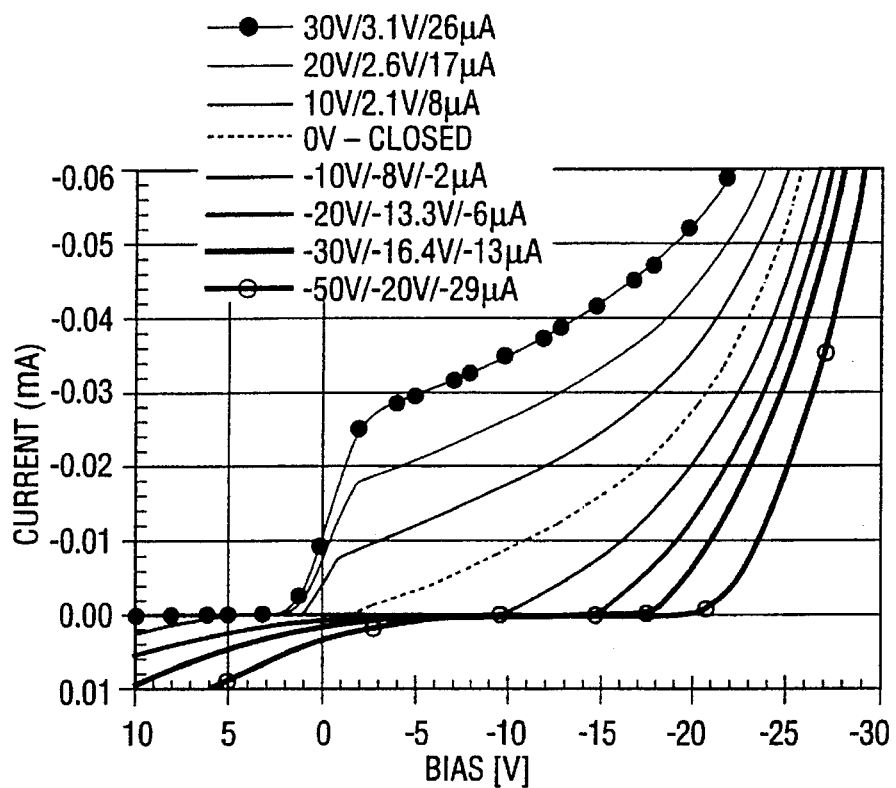

FIG. 36: $I_{AC}$ vs $V_{AC}$ characteristics of an Al/MEH-PPV/ PANI-CSA/MEH-PPV/Ca polymer grid TFT for various grid voltages, $V_G$, applied between the PANI-CSA network grid and the Al cathode.

Figure 37:
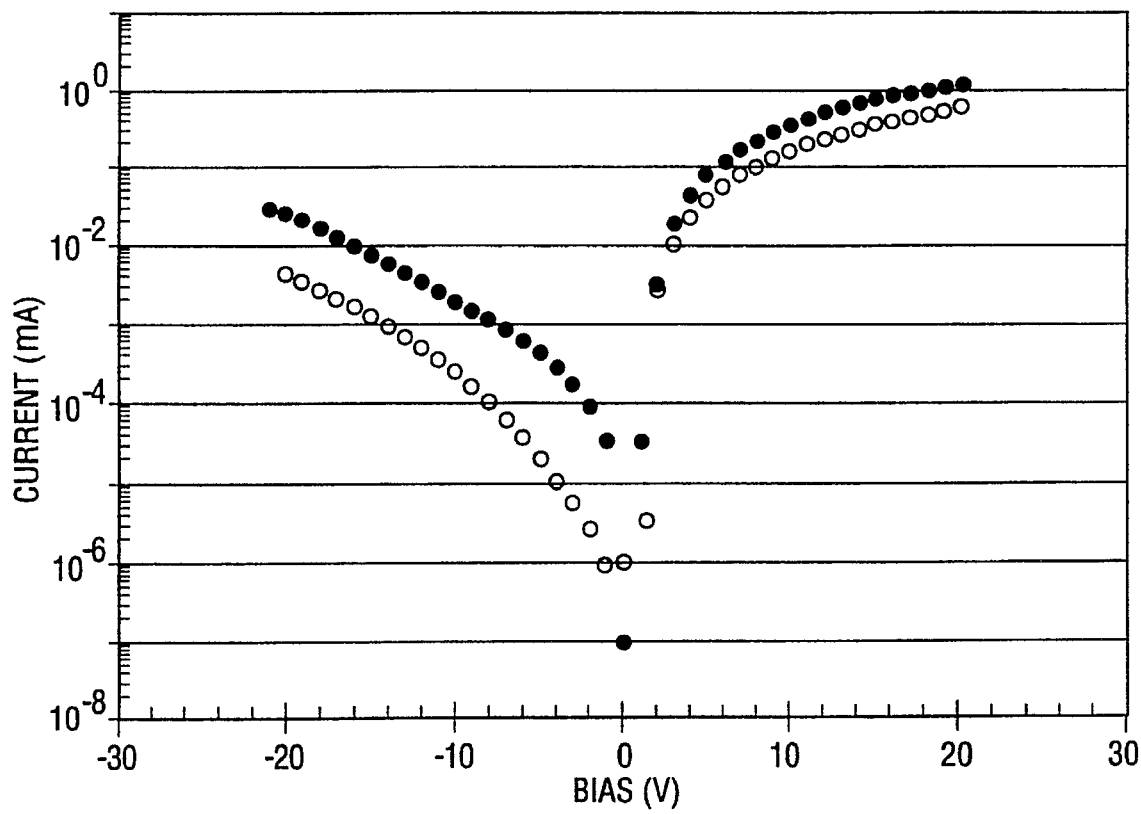

FIG. 37: I vs V curves (on semilog scale) for the Al/MEH-PPV/PANI-CSA half of the device and for the PANI-CSA/ MEH-PPV/Ca half of the device show that both exhibit the expected diode behavior.

Open circles: PANI-CSA/MEH-PPV/Al

Closed circles: PANI-CSA/MEH-PPV/Ca

Figure 38:
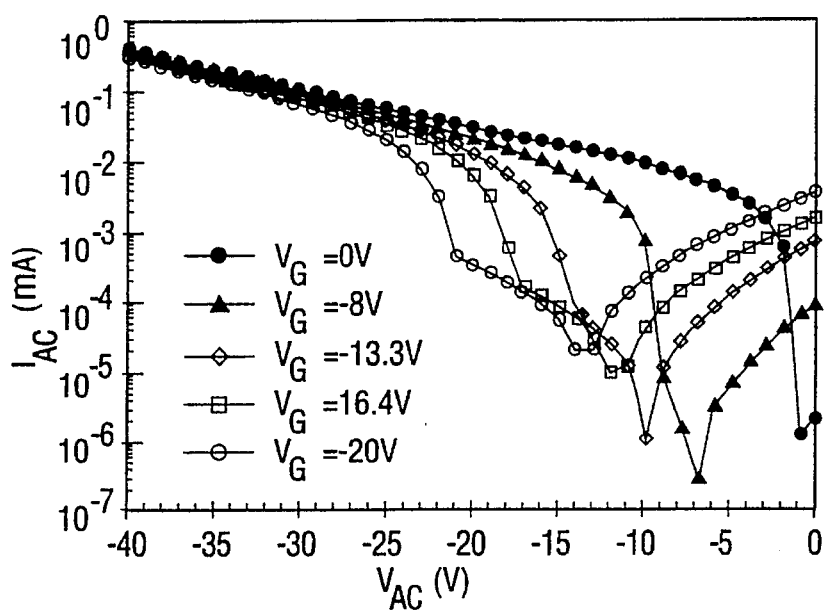

FIG. 38: $I_{AC}$ vs $V_{AC}$ characteristics of a Al/MEH-PPV/ PANI/MEH-PPV/Ca polymer grid triode plotted on a semi-log scale; for successively higher values of $|V_G|$, the steep onset of $I_{AC}$ (which defines the flat band condition) moves to proportionally to higher values of $|V_{AC}|$.

Figure 39:
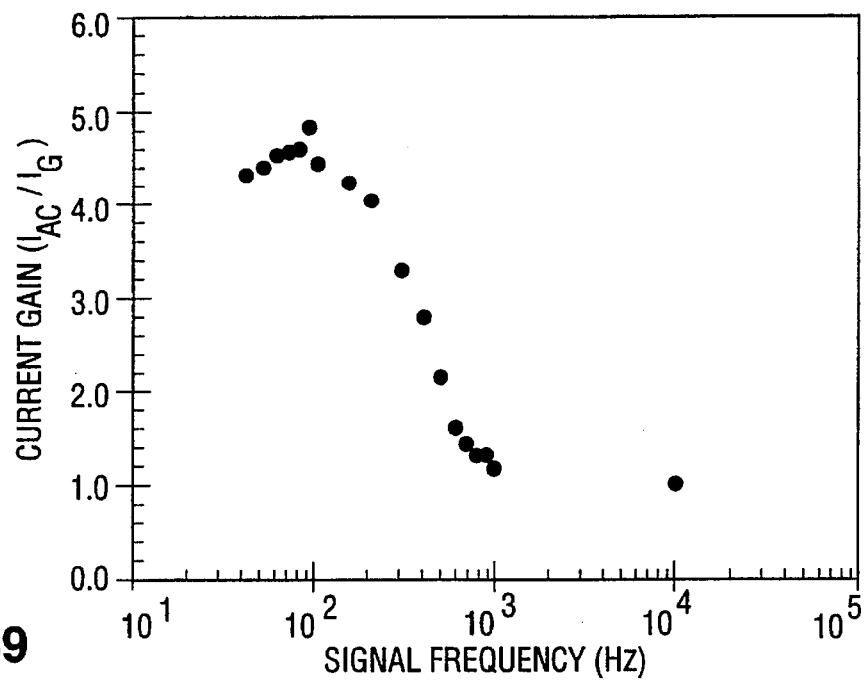

FIG. 39: The current gain, $G=\Delta I_{AC}/\Delta I_G$, of an Al/MEH-PPV/PANI/MEH-PPV/Ca device, where $\Delta I_G$ is the change in grid current and $\Delta I_{AC}$ is the corresponding change in current in the anode-to-cathode circuit.

Figure 40:
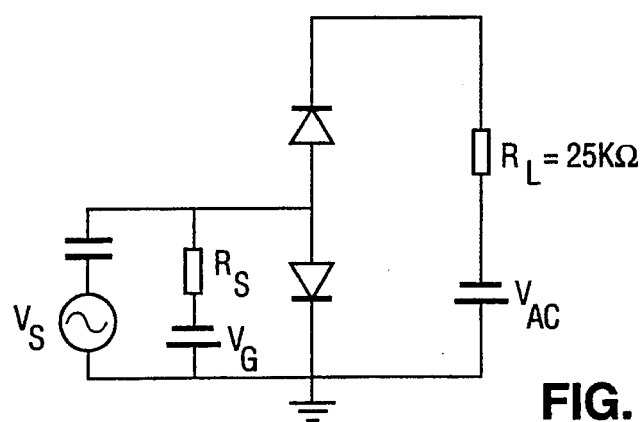

FIG. 40: A schematic of the test circuit is shown.

DETAILED DESCRIPTION OF THE INVENTION

Figure 1:
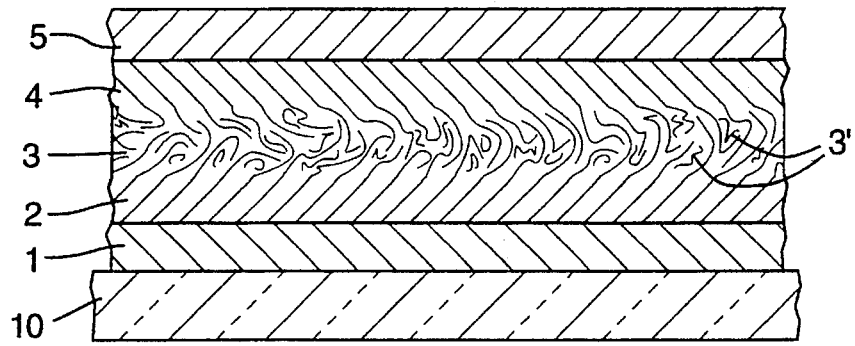
FIG. 1 is a schematic, not-to-scale cross sectional view of a polymer grid triode.
Figure 2A:
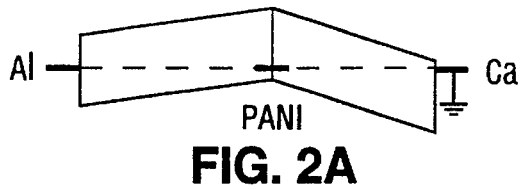
FIG. 2 depicts the electronic structure of an Al/MEH-PPV/PANI-CSA/MEH-PPV/Ca polymer grid triode under various bias conditions (as indicated).
Figure 3A:
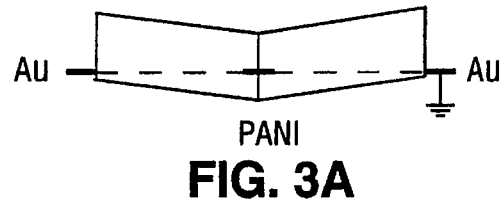
FIG. 3 depicts the electronic structure of an Au/P3OT/PANI-CSA/P3OT/Au polymer grid triode under various bias conditions (as indicated).
Figure 2B:
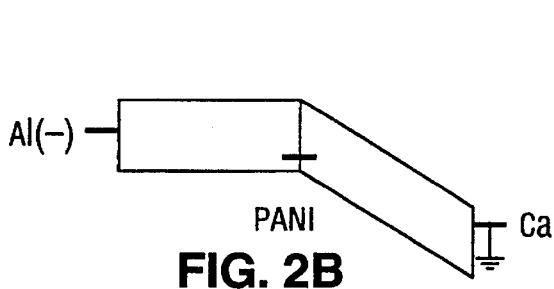
Figure 3B:
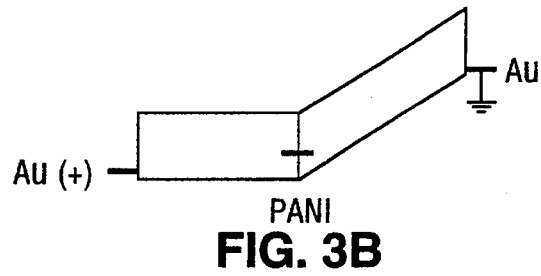
Figure 2C:
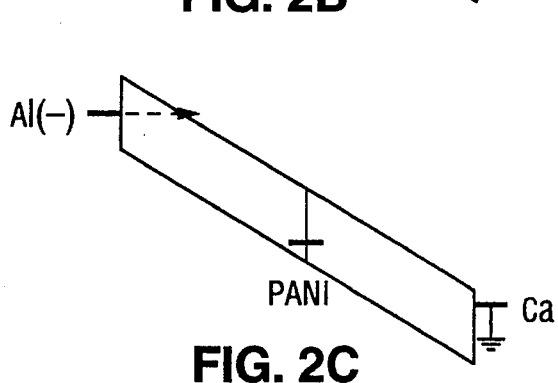
Figure 3C:
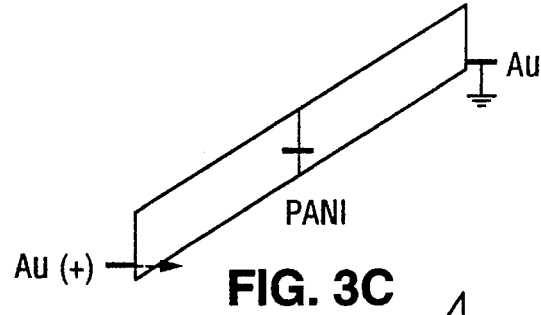
Figure 2D:
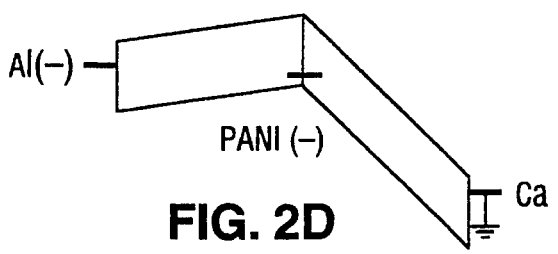
Figure 3D:
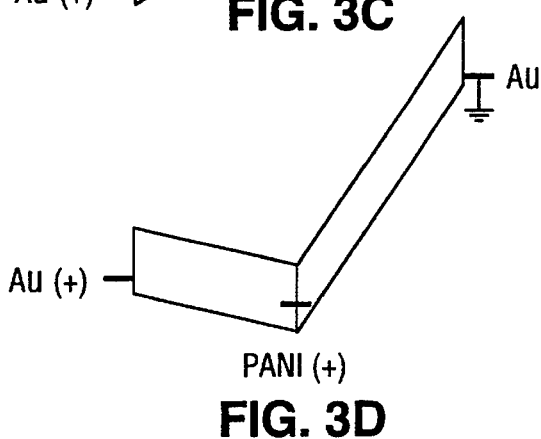

The structure of a representative polymer grid triode is set forth in FIG. 1. The structure shown there includes an optional substrate with the typical elements of the triode labeled as (1) through (5). A first electrode (1) is in contact with a first active electronic material (2), the top of which is in contact with the grid electrode (3) comprising a conducting polymer and an optional second active electronic material (3'). The top of the grid electrode is in contact with a third active electronic material (4), which is in contact with a second electrode (5).

The first and second electrodes, (1) and (5), in either order, are analogous to the anode and/or cathode of the vacuum tube triode; the polymer grid electrode (3) is analogous to the grid electrode of the vacuum tube triode. The first, second and third active materials ((2), (3'), and (4) transport electronic charge carriers. The transport is controlled and affected by the polymer grid electrode (3). The active electronic materials, (2), (3') and (4), which transport electronic charge carriers from (1) to (5) are conductors with various levels of electrical conductivity, one or more of which can be, for example, semiconductor materials; the active electronic materials, (2), (3') and (4) within the polymer grid triode can be the same, or they can be different.

In addition, while it is the case with the polymer grid triodes that active electronic material is present between the first and second electrodes, it is not required that active material always be present in all three locations. Thus, in some embodiments the polymer grid triodes may omit one or two of the active materials (2), (3') and (4).

In one embodiment of the polymer grid triode, the grid electrode (3) is a high surface area porous but electrically substantially continuous network made up of conducting polymer. The high surface area and porosity is reflected in a surface area of at least about 10 $cm^2$/gram, such as at least 25 and often at least 50 or even 100 $cm^2$/gram and porosity values of at least about 1%, especially at least about 5%, and often at least about 25%. Semiconducting material (3') fills, or partially fills, the void spaces within the high surface area porous network. The filled network is deposited on the first active electronic material (2) in contact with the first electrode (1) on a substrate. The top surface of the filled network grid electrode, (3) and (3'), is in contact with (4), which is in contact with the second electrode. Since there is a continuous path of conducting materials between the electrodes (1) and (5) and through the polymer network grid electrode (3), this configuration, shown in FIG. 1, is that of a polymer grid triode. Also, since the distance between the first and second electrodes (1) and (5) is set by the thickness of the layers in a vertical configuration, sub-micron dimensions are easily achieved by fabricating (1) through (5) in the form of thin films.

The materials chosen as conductive polymers for forming the polymer grid and as active electronic materials for elements (2), (3') and (4) play a direct role in determining the characteristics and performance of the triodes. For example, if one or more of the active electronic materials are luminescent, light-emitting polymer grid triodes can be achieved.

Polymer grid triodes can be either single-carrier or two-carrier devices. For single-carrier devices, carriers are injected at one electrode and withdrawn at the second electrode; for example, holes are injected into otherwise filled energy states of the semiconducting material at the anode and withdrawn at the cathode. For two-carrier polymer grid triodes, holes are injected into otherwise filled energy states of the semiconducting material at the anode, and electrons are injected into otherwise empty energy states at higher energy at the second electrode. For a description and analysis of one-carrier and two-carrier injection, see I. D. Parker, J. Appl. Phys., 75, 1656 (1994).

Generally, therefore, polymer grid triodes comprise an anode and a cathode. The anode serves as a hole injecting and/or electron withdrawing contact; typically, a conducting material with relatively high work function (relatively high ionization potential) is used. The cathode serves as an electron injecting and/or hole withdrawing contact; for example, a relatively low work function metal (Ca, Al, or the like) in the case of two-carrier devices, or metals such as copper or silver for the case of single-carrier, hole-only devices.

Single-carrier devices are useful and indeed often preferable for polymer grid triodes, for in this case, one can use stable metals such as, for example, copper or silver as the cathode (and hole withdrawing) material.

In the case of two-carrier light-emitting triodes, one of the two electrodes (typically the anode) is at least semi-transparent so as to enable the light to exit from the device. Examples of suitable transparent electrodes are indium/tin-oxide (ITO) and polyaniline (PANI) in the conducting, protonated emeraldine salt form. In two-carrier devices, the cathode is typically a relatively low work function conducting material. Any low work function (low ionization potential) conducting material can be used as the electron injecting contact; for example a conventional metal, a metal alloy or an electropositive conducting polymer such as, for example, n-type doped polyquinoline. The electropositive and electronegative character of the electrodes can be defined with respect to the semiconducting material within the polymer grid triode by standard electrochemical means.

ITO has been the most commonly used transparent electrode for EL devices. On the other hand, PANI, in the emeraldine salt form prepared according to U.S. Pat. No. 5,232,631, U.S. patent application Ser. No. 07/800,555 and 07/800,559, and in Applied Physics Letters, 60, 2711 (1992), has a higher work function than ITO, and therefore provides better hole injection into the polymer active layer. However, the surface resistance of a very thin PANI film often is too high for some applications. In order to avoid significant voltage drop in the electrode, it is desirable to decrease the surface resistance of the anode to less than about 100 ohms/square. Although this can be achieved using a thicker layer (>2500 Å) of PANI, the transmittance of such a PANI electrode is less than 70%, which would lead to more than a 30% loss in external quantum efficiency. U.S. patent application Ser. No. Applied Physics Letters 64 1245 1994 disclosed that when an ITO electrode is coated with an ultrathin layer (typically <1000 Å) of PANI, the bilayer electrode thus obtained has a minimum transmittance (~500 nm) at around 90%, a work function similar to that of PANI alone and a surface resistance below that of ITO. The bilayer PANI/ITO electrode offers special advantages for use in EL devices with improved efficiency and lower operating voltages.

The polymer grid electrode (3):

The polymer grid electrode (3) can be fabricated from a network comprising a conducting polymer.

Earlier work demonstrated that polyaniline, PANI, self-assembles into a conducting network morphology in blends with poly(methylmethacrylate) (C. Y. Yang, Y. Cao, P. Smith and A. J. Heeger, Synth. Met. 53, 293 (1993)). Near the percolation threshold, the network is fractal with a very high surface area at the PANI:host interface (Reghu Menon, C. O. Yoon, C. Y. Yang, D. Moses and A. J. Heeger, Macromolecules, 26, 7245 (1994)). The connected pathways in the PANI-CSA network cause such blends to exhibit electrical conductivity with values in excess of 1 S/cm at volume fractions of only a few per cent (w/w) PANI-CSA where CSA denotes camphor sulfonic acid. After selectively etching out the host polymer, the remaining conducting PANI-CSA network is rough and porous, and has a high surface area. This high surface area, porous network can be used for the polymer grid electrode (3). In this way, the contact area between the PANI-CSA and the active material (3') which fills the porous network can be increased dramatically. When the network is an equipotential with respect to either the first or second electrode (see FIG. 1), the surface roughness, with pointed and sharp fibrillar features, causes the electric field lines to be non-uniform, thereby enhancing the local electric field in regions near the network.

The polyaniline useful in this invention may vary widely and is not critical. Useful conductive polyanilines include the homopolymer, derivatives and blends with bulk polymers, which herein are collectively referred to as PANI. Examples of PANI are those disclosed in U.S. Pat. No. 5,232,631, which is incorporated by reference herein. Preferred PANI has a bulk conductivity of at least $10^{-3}$ S/cm. More preferred PANI has a bulk conductivity of at least $10^{-1}$ S/cm. Still more preferred PANI has a bulk conductivity of at least 1 S/cm. Most preferred PANI has a bulk conductivity of at least 100 S/cm.

Other network-forming conducting materials can be used in place of PANI. For example, conductive forms of polypyrrole can be polymerized within a porous matrix polymer (A. Mohammadi, I. Lundstrom, O. Inganas and W. R. Salaneck, Polymer, 31, 395 (1990)).

The method by which the porous conducting network is formed is not critical; the critical feature is that the resulting network be open and porous. Although any network forming material can be used, the ability to create the network spontaneously through self-assembly, as is the case for PANI, offers a special advantage to the fabrication of polymer grid triodes.

In one embodiment for forming the open network with access to the voids within the porous network, the metallic emeraldine salt form of PANI is prepared by protonation with functionalized sulfonic acids (e.g. CSA), yielding a conducting PANI-complex which is soluble in common organic solvents (Y. Cao, G. M. Tracy, P. Smith and A. J. Heeger, Appl. Phys. Lett. 60, 2711 (1992). Y. Cao, P. Smith and A. J. Heeger, Synth. Met. 48, 91 (1992)). PANI-CSA solutions (2%, w/w) were prepared using meta-cresol as the solvent. A highly soluble low molecular weight ($M_w$<10,000) polyester resin, PES, was used; the PES was separately dissolved in meta-cresol at a concentration of 20% w/w. Different concentrations of PANI:PES blends were prepared by mixing the PANI and PES solutions at different ratios; concentrations of PANI:PES were prepared at 5%, 10%, 25%, 40% and 100% in order to optimize the effects of high surface area and surface roughness. The PANI:PES blends were spin-cast onto glass substrates (half-coated with ITO) and subsequently dried in air at 50° C. for 12 hours. Subsequently, the PES was removed from the blend by exposing the PANI:PES blend thin film to a solvent which dissolved only the PES, leaving the conducting PANI network open, porous, and intact.

The Polymer Grid Electrode (3) Filled with Active Electronic Material (3'):

A wide variety of semiconducting and/or luminescent materials well known in the art can be used to fill, or partially fill, the open void spaces within the porous network. These include inorganic semiconductors such as silicon and especially amorphous silicon (deposited for example by chemical vapor deposition, CVD), semiconducting organic polymers, both conjugated and nonconjugated, and blends of conjugated polymers in host polymers, small molecule organic semiconductors and the like.

Examples of semiconducting conjugated polymers include but are not limited to poly(phenylenevinylene), PPV, and soluble derivatives of PPV, such as MEH-PPV (U.S. Pat. No. 5,189,136) and BCHA-PPV (U.S. patent application Ser. No. 07/626463), PPPV (C. Zhang et al, in Synth. Met., 62, 35, (1994) and references therein) and the like, the soluble derivatives of polythiophene, for example the poly(3-alkylthiophenes) (C. Zhang et al, J. Appl. Phys. 73, 5177, (1993)) and other semiconducting conjugated polymers, some of which exhibit photoluminescence; and blends of such semiconducting and/or luminescent conjugated polymers in hole-transporting or electron transporting polymers (C. Zhang et al, in Synth. Met., 62, 35, (1994)).

Small molecule semiconducting and/or luminescent organic materials can be used, such as those disclosed in the following: (C. W. Tang, S. A. Van Syke, Appl. Phys. Lett. 51, 913 (1987); C. W. Tang, S. A. Van Syke and C. H. Chen, J. Appl. Phys. 65, 3610 (1989); C. W. Tang, S. A. Van Syke, U.S. Pat. No. 4,769,292; C. Adachi, S. Tokito, T. Tetsui and S. Saito, Appl. Phys. Lett., 55, 1489 (1989); C. Adachi, S. Tokito, T. Tetsui and S. Saito, Appl. Phys. Lett., 56, 799 (1989); M. Nohara, M. Hasegawa, C. Hosohawa, H. Tokailin, T. Kusomoto, Chem. Lett. 189 (1990)). Examples include but are not limited to the following:

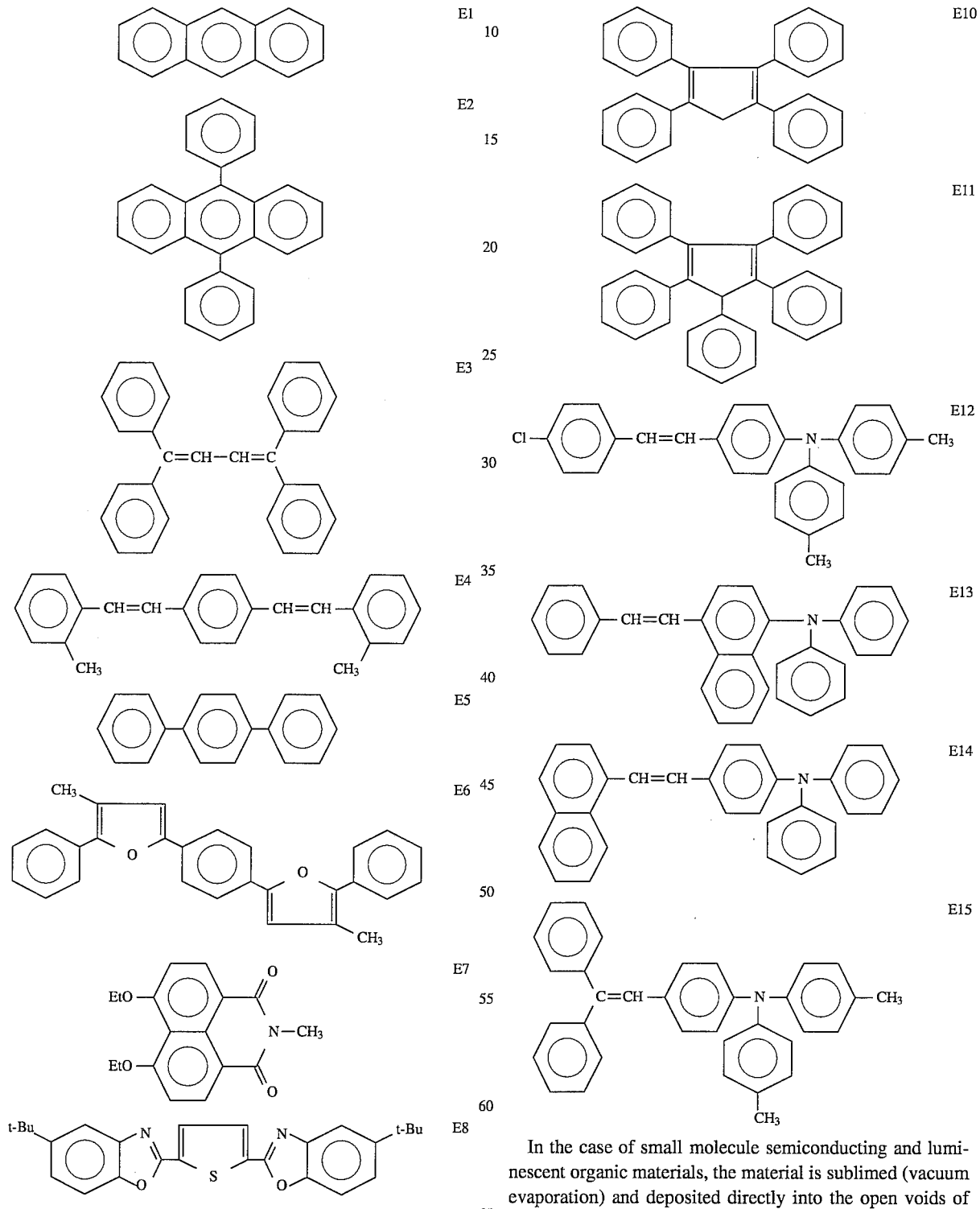

In the case of small molecule semiconducting and luminescent organic materials, the material is sublimed (vacuum evaporation) and deposited directly into the open voids of the pre-formed porous network. Oligomers of thiophene, for example, comprising four, five or six thiophene rings, are known in the prior art and have been sublimed to form thin films for use in FETs (F. Garnier, G. Horowitz, X. Peng, and D. Fichou, Adv. Mater. 2, 592 (1990)).

Inorganic semiconductors can be used, a requirement being that such inorganic semiconductors be deposited by a sufficiently low temperature process that the network is not adversely affected. For example, CVD methods can be used to deposit inorganic semiconducting material into the open voids within the porous network.

In the case of semiconducting polymer materials, the active semiconducting (and luminescent, when appropriate) material may be cast from solution into the open void spaces within the porous network. In this case, the semiconducting material must be in solution in a solvent which does not dissolve the conducting network material. Alternatively, the active electronic material might be vapor deposited into the voids.

Typical film thicknesses for the network grid electrode filled with semiconductive material range from a few hundred Angstrom units to a few thousand Angstrom units (1 Angstrom unit=$10^{-8}$ cm). Although the active film thicknesses are not critical, polymer grid triode performance can typically be improved by using thinner networks.

In one embodiment, MEH-PPV was spin-cast at 1000 rpm from solution in xylene directly onto the thin film of the PANI:PES blend. Since xylene is an excellent solvent for PES, the PES in the PANI:PES blend was etched out by the xylene and subsequently carried away by the excess MEH-PPV solution during the spin-casting process. Hence, in a single step, MEH-PPV replaced PES to fill the voids in the porous structure within the PANI:PES network. This concept can be readily generalized to other soluble semiconducting materials.

The various elements of the devices of the present invention can be fabricated by any of the techniques well known in the art, such as solution casting, sputtering, evaporation, chemical vapor deposition, precursor polymer processing, melt-processing, and the like, or any combination thereof.

Built-in Potentials and Electronic Structure of Polymer Grid TFTs:

Because the anode, the cathode, and the polymer grid electrode are typically fabricated from different materials, there are built-in potentials at zero bias; i.e. at zero voltage between the anode and the cathode, at zero voltage between the polymer grid electrode and the anode, and at zero voltage between the polymer grid electrode and the cathode.

The design of polymer grid triodes for specific circuit applications should take into account the use of particular conducting materials for the electrodes. The electrode materials should have work functions which optimize the electrode's characteristics needed for that application. For example, a polymer grid triode with gold as the anode and cathode and a polymer grid with PANI as the network polymer has built in potentials analogous to those found in a PNP transistor.

Similarly, for example, the conducting form of PANI is more electronegative than ITO. Thus, for example, if the anode is ITO and the polymer grid electrode comprises PANI, there will be a built-in potential equal to the difference in work functions between PANI and ITO. Ca has a low work function. Thus, for example, if Ca is used as the cathode material and the polymer grid electrode comprises PANI, there will be a built-in potential between the cathode and the polymer grid electrode equal to the difference in work functions between Ca and PANI. These built-in potentials can be estimated from knowledge of the relative electrochemical potentials, or alternately from knowledge of the relative work function of the materials which comprise the cathode, the anode, and the network electrode.

Since in general the external voltage between any two of the three electrodes is applied in addition to the built-in potential between that pair of electrodes, the built-in potentials affect the response of the polymer grid triode to external voltages. The design of polymer grid triodes for specific circuit applications should utilize specific conducting materials for the electrodes, said materials having work functions which optimize the electrical characteristics for that application. For example, a polymer grid triode, with gold (Au) as the anode and cathode and with the polymer grid comprising PANI in the conducting form, has built-in potentials analogous to a pnp-transistor. Similarly, a polymer grid triode with aluminum, as the anode and cathode and with a polymer grid comprising polyaniline has built in potentials analogous to an npn transistor. Analyses of the current vs voltage and/or light output vs voltage and/or light output vs current of polymer grid triodes are useful for planning the utilization of such polymer grid triodes in circuit applications. When carrying out such analyses, it is useful to include the built-in potentials.

The electronic structure of the polymer grid triode is analogous to that of npn or pnp transistors; in each case the device can be viewed as constructed from two coupled diodes, connected back-to-back. Polymer grid triodes utilize semiconducting polymer/electrode systems which are known to form high quality diodes. Important examples include PANI-CSA/MEH-PPV/Ca and PANI-CSA/P3OT/Au, both of which are diodes with high rectification ratio In the PANI-CSA/MEH-PPV/Ca diode, Ca is the cathode, and PANI is the anode and in the PANI-CSA/MEH-PPV/Al diode, AL is the cathode, and PANI is the anode; whereas in the PANI-CSA/P3OT/Au diode, PANI is the cathode, and Au is the anode.

The electronic structure of the Al/MEH-PPV/PANI-CSA/ MEH-PPV/Ca polymer grid triode is shown in FIG. 2. Under zero bias conditions, there is a common chemical potential. As a result of the different work functions of the Al, PANI-CSA and Ca, the built-in potential is analogous to that of an npn transistor. FIG. 2 also shows the flat-band condition where current just begins to flow. At still higher anode-to-cathode voltages ($V_{AC}$), the device is turned-on; electrons are injected into the π*-band of MEH-PPV at the Al electrode. The electric field in the semiconductor forces the injected electrons toward the polymer grid. If the polymer network is of sufficiently low density, some fraction of the injected carriers will continue to still lower energy and be withdrawn at the Ca anode. Under these conditions, current ($I_{AC}$) will flow in the external anode-to-cathode circuit. $I_{AC}$ can be controlled by varying the grid bias. With reverse bias on the input diode, $I_{AC}$ will be limited by the reversed bias current, as shown in the Figure. If the rectification ratio is high, $I_{AC}$ will be cut-off by the bias voltage applied to the polymer grid. As shown in the Examples, this is indeed the case.

Note that FIG. 2 is drawn with the Ca electrode grounded (the anode) and the Al electrode as the cathode. These could be interchanged; i.e. the Ca electrode used as the cathode and the grounded Al electrode used as the anode.

The importance of the polymer network grid is evident in FIG. 2. Since PANI-CSA is an excellent "hole injector" for MEH-PPV, (Y. Yang and A. J. Heeger, Appl. Phys. Lett., 64, 1245 (1994)). PANI-CSA is also an excellent "electron extractor" from MEH-PPV. Thus if one were to fabricate the Al/MEH-PPV/PANI-CSA/MEH-PPV/Ca device with a solid film of PANI, there could be no true $I_{AC}$. Under forward bias conditions shown in FIG. 2, any electrons injected at the Ca electrode would be extracted at the PANI electrode. The device would be two uncoupled diodes connected back-to-back with no possibility of gain. In this sense, the analogy of the polymer network grid in the polymer grid triode with the grid in the vacuum tube triode is genuine.

The electronic structure of the Au/P3OT/PANI-CSA/P3OT/Au polymer grid triode is shown in FIG. 3. Again, under zero bias conditions there is a common chemical potential. In this case, since Au is more electronegative than PANI-CSA, the built-in potential is analogous to that of an pnp transistor. FIG. 3 also shows the same device in the flat-band condition where $I_{AC}$ just begins to flow. At still higher voltages, holes are injected into the π-band of P3OT at the Au anode, and the internal electric field forces the injected holes toward the polymer grid. If the polymer network is of sufficiently low density, some fraction of the injected holes will continue to still lower energy and be withdrawn at the Au cathode. Under these conditions, $I_{AC}$ will flow in the external anode-to-cathode circuit. $I_{AC}$ can be controlled by varying the grid bias. With reverse bias on the input diode, $I_{AC}$ will be limited by the reversed bias current, as shown in the Figure. Once again, if one were to fabricate the Au/P3OT/PANI-CSA/P3OT/Au device with a solid film of PANI-CSA, there could be no true $I_{AC}$; under the conditions shown in FIG. 3, any holes injected at the Au anode would be extracted at the PANI electrode. The device would again be nothing more than two diodes connected back-to-back with no possibility of gain.

The electronic structures shown in FIGS. 2 and 3 are drawn assuming each anode/polymer/cathode tri-layer is a tunnel diode, as described in detail by Parker (I.D. Parker, J. Appl. Phys., 75, 1656 (1994)). Similar drawings can be made for anode/polymer/cathode Schottky-like diodes, as would be appropriate when the depletion length in the polymer semiconductor layer is much less than the layer thickness (S.M. Sze, Physics of Semiconductor Devices (Wiley, N.Y., 1981)).

Control of the Balance of Electron and Hole Currents by Polymer Grid Electrodes

In a two-carrier polymer grid triode three terminal device, when the polymer grid electrode is biased negative with respect to the anode. The hole current can be similarly controlled by a polymer grid.

Thus, the ability to separately control and balance the electron and hole currents can be designed into such devices by including two independent network grids, separated by a semiconductor layer, that can be separately biased with respect to the anode and the cathode, respectively.

The following general methods and specific examples are presented merely to illustrate the invention and are not to be construed as limitations thereon.

EXAMPLES

Example 1

A polymer grid triode as shown in FIG. 1 was prepared but without the cathode layer (5). The metallic emeraldine salt form of PANI was prepared by protonation with functionalized sulfonic acids (for example, CSA or dodecylbenzenesulfonic acid, DBSA), yielding a conducting PANI-complex soluble in common organic solvents. In this Example, PANI-CSA solutions (2%, w/w) were prepared using meta-cresol as the solvent. A highly soluble low molecular weight ($M_w$<10,000) polyester resin (PES) was separately dissolved in meta-cresol at a concentration of 20% w/w and used to make the PANI:PES blends. Different concentrations (w/w) of PANI:PES blends were prepared by mixing the PANI and PES solutions at different ratios. In this Example, concentrations of PANI:PES were prepared at 5%, 10%, 25%, 40% and 100%. The PANI:PES blends were spin-cast onto glass substrates (half-coated with ITO) and subsequently dried in air at 50° C. for 12 hours. The thickness of the different PANI:PES layers was held constant at ~1200 Å. MEH-PPV was then spin-cast at 1000 rpm from solution in xylene (8 mg/ml concentration). Since xylene is also an excellent solvent for PES, the PES in the PANI:PES blend was etched out by the xylene and subsequently carried away by the excess MEH-PPV solution during the spin-casting process. Hence, MEH-PPV replaced PES in the porous structure within the PANI:(PES) network, thereby increasing the interface area between MEH-PPV and the PANI-CSA electrode; the bracket, ( ), designating that the PES had been removed.

Figure 4:
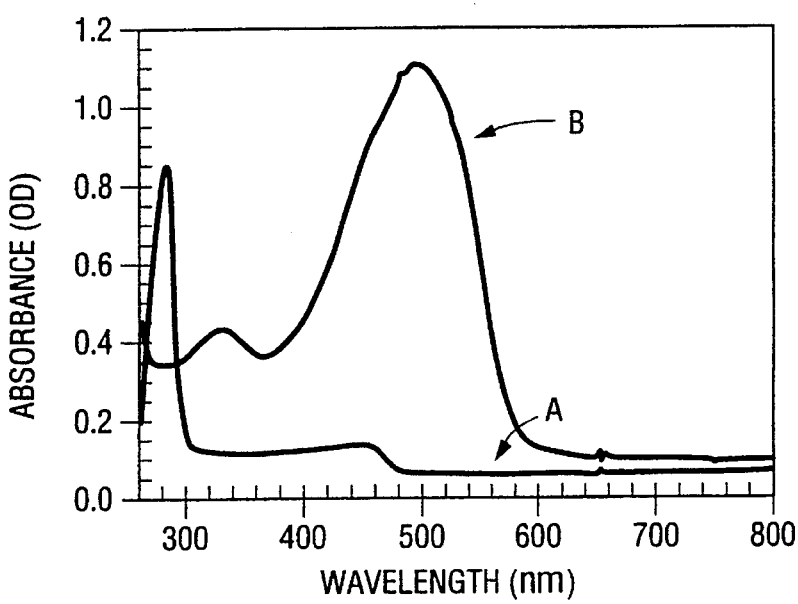
FIG. 4 is an absorption spectrum derived in Example 1 of a mixture of a conductive polymer and a host polymer useful for preparing a polymer grid, before and after the host polymer is removed and replaced with an active electronic material.

FIG. 4 shows the absorption spectrum of a PANI:PES blend at a concentration of 5% (w/w) PANI. The absorption peak characteristic of PES is clearly seen at 290 nm. The absorption spectrum of the PANI:(PES) layer over-coated with MEH-PPV is also shown in FIG. 1. The PES peak has disappeared after the spin-casting step during which the MEH-PPV layer was deposited (the MEH-PPV absorption is clearly seen); a clear indication that the PES was removed by the xylene of the MEH-PPV polymer solution and replaced by MEH-PPV within the porous network. Absorption measurements of PANI:PES blends with other concentrations of PANI showed the same indications of PES removal (and replacement by MEH-PPV) after over-coating with MEH-PPV.

This Example demonstrates that the conducting network can be formed and that said network can be filled with semiconducting and/or luminescent material. The filled conducting network can be used to fabricate the polymer grid (3) filled with the active electronic material (3'), as shown in FIG. 1.

Example 2

The surface of the MEH-PPV film above the PANI-network layer is very rough for PANI:PES blends at concentrations near the percolation threshold (e.g. 1% and 5%). Using a Dektak profilometer, the length scale of the surface roughness of the network filled with MEH-PPV which initially contained 5% PANI was measured; the peak to valley variations were ~300–400 Å. Light scattering by the residual PANI-CSA network at these concentrations was quite strong, an additional indication of surface roughness. The surface roughness of the MEH-PPV film is diminished when 10% PANI:PES blends were used; at concentrations of PANI-CSA in excess of 25%, the PANI-CSA anode appeared smooth to the Dektak probe.

This example demonstrates the existence of surface roughness associated with the conducting network used for fabricating the polymer grid electrode (3) of FIG. 1.

Example 3

Figure 5:
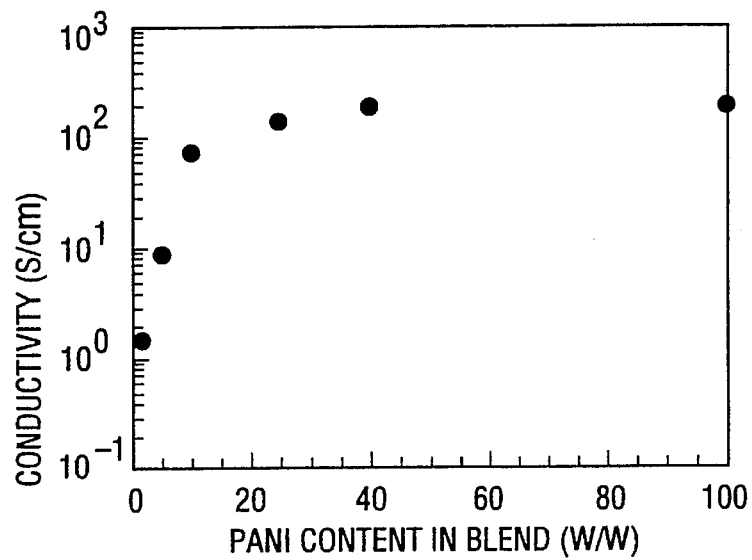
FIG. 5 is a graph of the electrical conductivities of various conductive polymer/host polymer blends as measured in Example 3.

The electrical conductivity of the PANI:PES blends was monitored by measurements using the standard two probe technique. FIG. 5 shows the conductivity of the PANI:PES blends as a function of the PANI weight fraction. Conductivities of order 1 S/cm were obtained in blends containing as low as 1% PANI-CSA. The conductivity of the network showed a steep initial increase, leveling off at about 25% PANI-CSA at conductivities close to 200 S/cm, similar to results reported earlier for PANI-CSA:PMMA blends (C. Y. Yang, Y. Cao, P. Smith and A. J. Heeger, Synth. Met. 53, 293 (1993)).

The resistance of the PANI:PES film was measured both before and after the MEH-PPV spin-casting process to ensure that the PANI network remained intact. The data in Table 1 show the PANI network resistance before and after removal of the PES during spin-casting the MEH-PPV. The resistance values of the 1% and 5% blends actually decreased by 10–20% after spin-casting the MEH-PPV layer, while the 10%, 25% and 40% samples showed no significant changes. Thus, the PANI network remains after spin-casting the active luminescent polymer layer. Most likely, the decrease in resistance observed upon removal of the PES from the dilute PANI:PES blends was due to the partial collapse of the tenuous initial PANI-CSA network, resulting in increased contact between the conducting polymer (PANI) fibrils.

This Example demonstrates that the conducting PANI network is robust and remained intact during and after subsequent processing steps. Thus, the PANI network can be used in the fabrication of the polymer grid electrode (3) filled with active electronic material (3').

TABLE 1

Resistance Values of PANI:PES Blends Before and After Removal of the PES

| % PANI | Resistance before removal of the PES (Ω) | Resistance after removal of the PES (Ω) | Change |
|---|---|---|---|
| 1 | 70.4K | 53.8K | −24% |
| 5 | 6.1K | 5.1K | −16% |
| 10 | 800 | 810 | +1.3% |
| 25 | 650 | 640 | −0.6% |
| 40 | 410 | 440 | +6% |

Example 4

Figure 6:
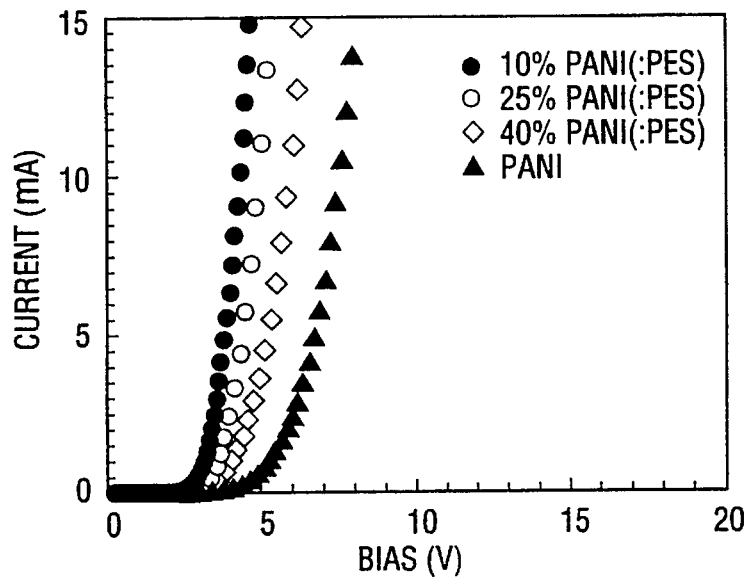
FIG. 6 is a series of graphs generated in Example 4 showing current vs voltage characteristics for devices containing polymer grids fabricated from different blends of conductive polymer and host polymer.

FIG. 6 shows the current vs voltage ($I_{AC}$ vs $V_{AC}$) characteristics between the first and second electrodes (anode, A, and cathode, C) of ITO/PANI-network/MEH-PPV/Ca light-emitting structures with different initial concentrations of PANI:PES in the network electrodes: 10% PANI:(PES), 25% PANI:(PES), and 40% PANI:(PES); the bracket, ( ), denotes that the PES had been removed from the PANI network. In all three cases, because of the asymmetric cathode (low work function) and anode (higher work function), the $I_{AC}$ vs $V_{AC}$ curves were rectifying; in each case the rectification ratio was greater than 1000 (ratio of forward to reverse current at ± a specific applied voltage).

Similar devices using pure PANI/ITO (i.e. 100% PANI) as the electrode were also fabricated for comparison. Charge carrier injection into the MEH-PPV was enhanced dramatically by using the PANI-network electrode, resulting in significantly lower device operating voltages. The smaller concentrations of PANI in the initial PANI:PES blends provided higher surface area and hence better charge injection and progressively lower device operating voltages.

This Example demonstrates enhanced carrier injection with polymer network grids over that in similar devices without the polymer network grids.

Example 5

Figure 7:
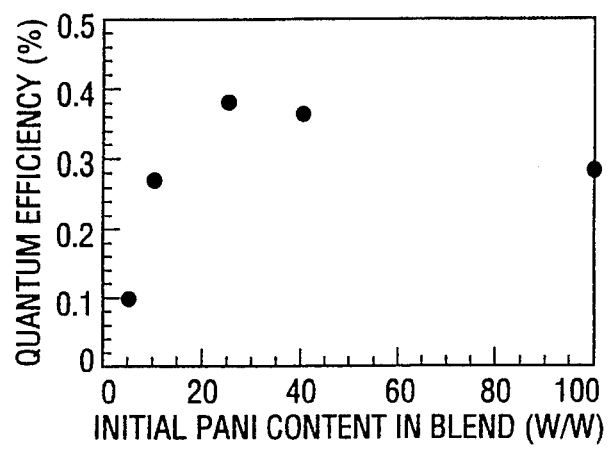
FIG. 7 shows the external quantum efficiency (QE) of the polymer grid light-emitting structure as a function of the fraction of conductive polymer in the initial conductive polymer/host polymer blends as measured in Example 5.

Light emission from the devices fabricated with the light-emitting polymer grid was measured using the devices for which the $I_{AC}$ vs $V_{AC}$ curves were measured in Example 4. In all cases, the electroluminescent emission was proportional to the current. FIG. 7 shows the external quantum efficiency (QE) of these devices; the QE was maximized at a concentration of PANI in the initial PANI:PES blend of approximately 25%.

Figure 8:
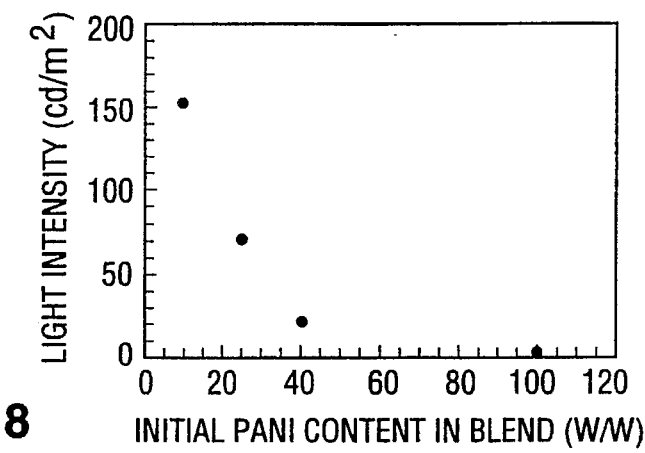
FIG. 8 shows the brightness of the polymer grid light-emitting structure at 4 volts forward bias as a function of the fraction of conductive polymer in the initial conductive polymer/host polymer blends as measured in Example 5.

The PANI-network electrode dramatically increases the brightness of the electroluminescent emission. FIG. 8 shows the brightness at 4 volts forward bias as a function of the concentration of PANI-CSA in the initial PANI:PES blends. The data in FIG. 8 were obtained from a series of devices all with the same thickness of MEH-PPV (1300 Å). For 10% PANI in the initial blends, the brightness was approximately 160 cds/m², an increase by nearly two orders of magnitude over that obtained from the simple PANI/ITO bilayer.

This Example demonstrates that light emission is enhanced by the polymer grid; the electroluminescent emission turns on at a significantly lower voltage with brightness that is significantly enhanced over emission from devices without the polymer grid electrode.

Example 6

The strong local electric field caused by the roughness of the PANI-CSA electrode serves to further enhance charge injection. Charge is injected from the electrodes into the # (for holes) and π* (for electrons) bands of MEH-PPV via tunneling (I. D. Parker, J. App. Phys, 75, 1656 (1994)). Fowler-Nordheim field-emission tunneling theory predicts (R. H. Fowler and L. Nordhelm, Proc. Roy. Soc. (London), 119A, 173 (1928)):

$$I \propto F^2 \exp(-\kappa/F) \quad (1)$$

where I is the current, F is the electric-field strength, and k is a parameter that depends on the shape of the barrier at the metal-polymer contact. Assuming that the injected charge tunnels through a triangular barrier at the interface, the constant κ in Eqn 1 is given by (S. M. Sze, Physics of Semiconductor Devices (Wiley, N.Y., 1981)):

$$\kappa = 8\pi(2m^*)^{1/2}\phi^{3/2}/3qh \quad (2)$$

In Eqn 2, φ is the barrier height, and m* is the effective mass of holes in the semiconducting polymer. Eqn 2 assumes that the electric field is constant across the device and that the effective mass equals the free electron mass. Since the barrier height associated with the PANI-CSA/MEH-PPV interface was measured in parallel experiments using dense PANI films as electrodes, Eqns 1 and 2 can be used to infer the enhancement in the local field, $F_{loc}$, by assuming that $\kappa_o$ is determined by the intrinsic barrier height ($\phi_o$) which is characteristic of the PANI-CSA/MEH-PPV interface. A Fowler-Nordheim plot can therefore be used to directly estimate the local field enhancement.

Figure 9:
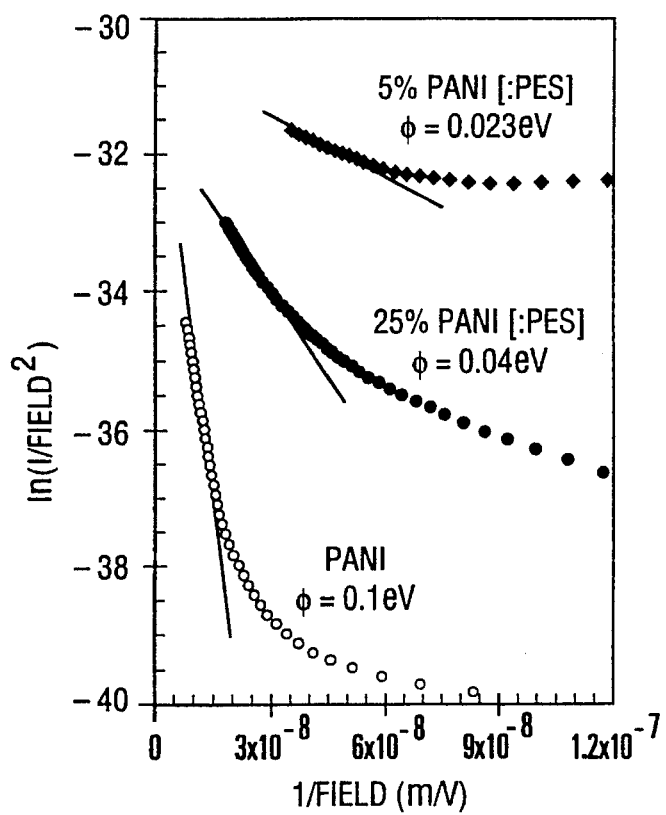
FIG. 9 provides Fowler-Nordheim plots derived in Example 6 for polymer grid-containing single carrier ("hole-only") devices with 5% and 25% conductive polymer in the initial conductive polymer/host polymer blends. Similar data obtained from diodes rather than triodes without the polymer grid are shown for comparison.

To measure the apparent barrier height at the roughened PANI/MEH-PPV interface, hole-only devices were fabricated using copper (Cu) as the cathode material. FIG. 7–9 shows a plot of ln(I/F²) vs. 1/F for a PANI:PES (25%)/MEH-PPV/Cu device, a PANI:PES (5%)/MEH-PPV/Cu device, and a PANI (no PES)/MEH-PPV/Cu device, all fabricated with a 1300 Å MEH-PPV layer. Since the plot assumed a uniform electric field strength across the MEH-PPV, the resulting estimate of the electric field was an average; the actual local field was even larger near sharp features in the PANI network electrode.

The barrier heights for the PANI network electrodes were calculated using Eqns, 1 and 2 (values are listed on FIG. 9) The 0.1 eV barrier height characteristic of the PANI/MEH-PPV interface was apparently lowered by forming the roughened PANI high surface area electrode; e.g. for the 5% PANI:PES blend network, the apparent barrier height was lowered by a factor of five. Using Eqn 1 and 2 and the data for the apparent barrier height as indicated in FIG. 9, the data indicated that the average local field was enhanced by approximately an order of magnitude.

This Example demonstrates that the enhanced local electric field is a feature of the irregular rough surface of the self-assembled PANI-CSA network electrode.

Example 7

Figure 10:
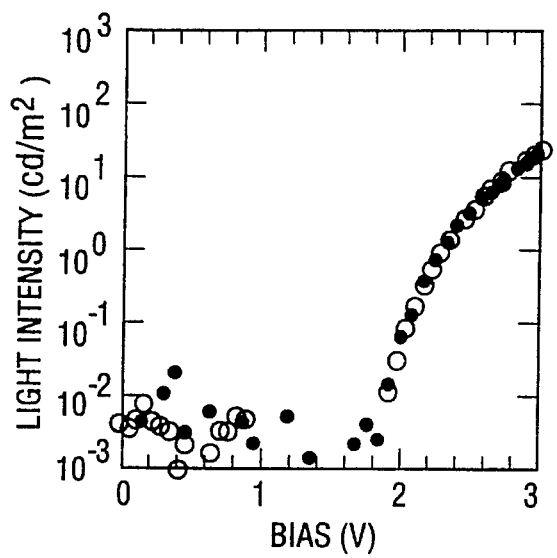
FIG. 10 shows light intensity of a light-emitting polymer grid triode with PVK as the first active electronic material and MEH-PPV as the second and third active electronic materials. The data are compared with results from devices with the polymer grid alone; i.e. without the PVK layer. These data were generated in Example 7.
Figure 11:
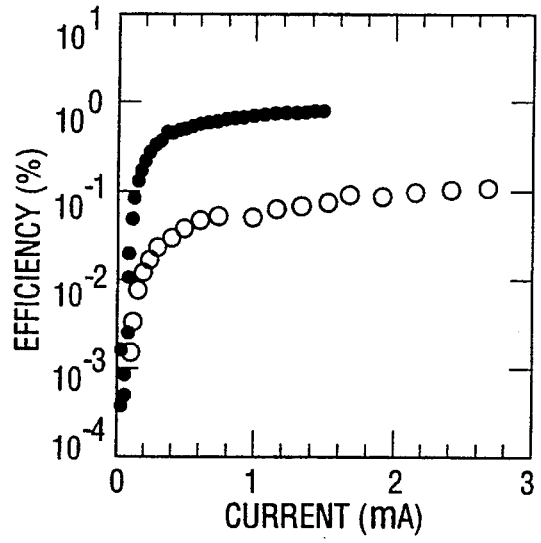
FIG. 11 shows efficiency of a light-emitting polymer grid triode with PVK as the first active electronic material and MEH-PPV as the second and third active electronic materials. The data are compared with results from devices with the polymer grid alone; i.e. without the PVK layer. These data were generated in Example 7.
Figure 12:
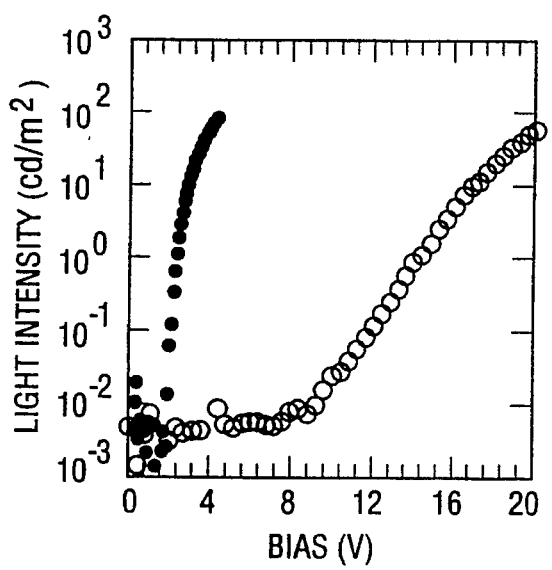
FIG. 12 is a graph comparing light intensity vs applied voltage for light-emitting devices containing and not containing a polymer grid. These data were generated in Example 7.

A polymer grid light-emitting triode was fabricated in the configuration shown in FIG. 1 with a solid thin film of PVK as the first active electronic material (2) and a PANI network electrode (3) filled with MEH-PPV (3') as the polymer grid electrode. The initial PANI:PES blend contained 5% PANI. The MEH-PPV was filled into the network and the PES removed in a single step. The MEH-PPV extended beyond the PANI network to form the third active electronic material, (4) in FIG. 1. ITO was used as the anode (for hole injection) and Calcium was used as the cathode (for electron injection). The results are shown in FIGS. 10–12.

Using the polymer grid light-emitting triode configuration with PVK as the first active electronic material (2) yielded comparable light intensity (FIG. 10) and higher efficiency (FIG. 11) than with PANI network alone and much improved performance over use of ITO alone as the hole injecting electrode in a diode configuration. FIG. 12 shows that the polymer grid light-emitting triode had a turn-on voltage much below that of the corresponding device without the filled network electrode. At 4 volts, the brightness was in excess of 100 cds/m².

This Example demonstrates that the use of the first active electronic material (in this case PVK), (2) in the polymer grid triode configuration of FIG. 1, serves to enhance the light emission from the light-emitting polymer grid triode.

Example 8

Figure 13:
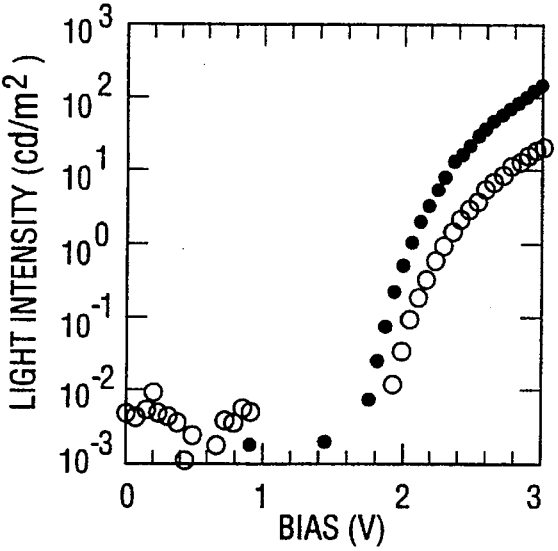
FIG. 13 is a graph comparing light intensity vs applied voltage for polymer grid-containing devices with and without a polyaniline active electronic material. These data were generated in Example 8.
Figure 14:
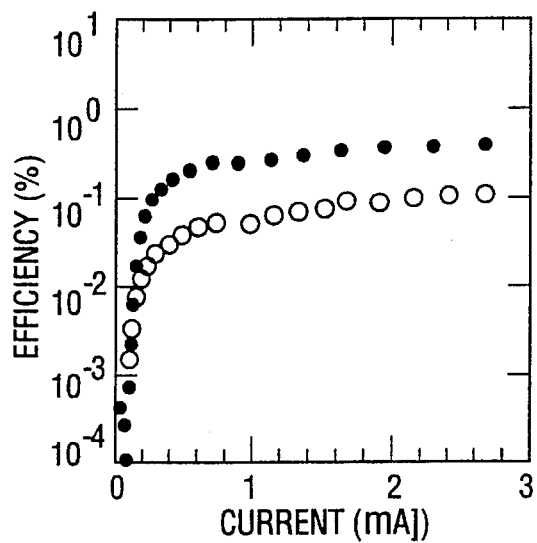
FIG. 14 is a graph comparing efficiency vs current for polymer grid-containing devices with and without a polyaniline active electronic material. Thee data were generated in Example 8.
Figure 15:
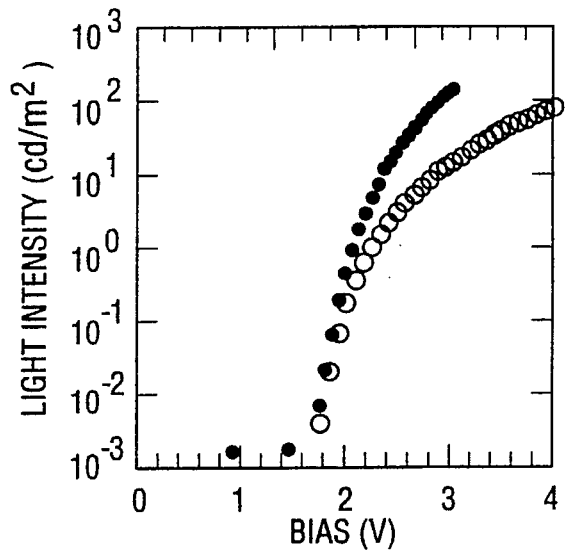
FIG. 15 is a graph comparing light intensity vs applied voltage for light-emitting devices containing and not containing a polymer grid. These data were generated in Example 8.

A polymer grid light-emitting triode was fabricated in the configuration shown in FIG. 1 with a solid thin film of PANI in the conducting, protonated emeraldine salt form as the first active electronic material (2) and a PANI network as the polymer grid electrode (3) filled with MEH-PPV (3'). The initial PANI:PES blend contained 5% PANI. The MEH-PPV was filled into the network and the PES removed in a single step (3'). The MEH-PPV extended beyond the PANI network to form the third active electronic material (4) on FIG. 1. ITO was used as the anode (for hole injection) and calcium was used as the cathode (for electron injection). The results are shown in FIGS. 13–15.

Using the polymer grid light-emitting triode configuration with PANI as the first active electronic material (2) yielded higher light intensity (FIG. 13) and higher efficiency (FIG. 14) than with PANI network alone and much improved performance over use of ITO alone as the hole injecting electrode in a diode configuration. FIG. 15 shows that the polymer grid light-emitting triode has a brightness significantly greater than that of the corresponding device without the filled network electrode.

This Example demonstrates that the use of the first active electronic material (in this case PANI), (2) in the polymer grid triode configuration of FIG. 1 serves to enhance the light emission from the light-emitting polymer grid triode.

Example 9

Figure 16:
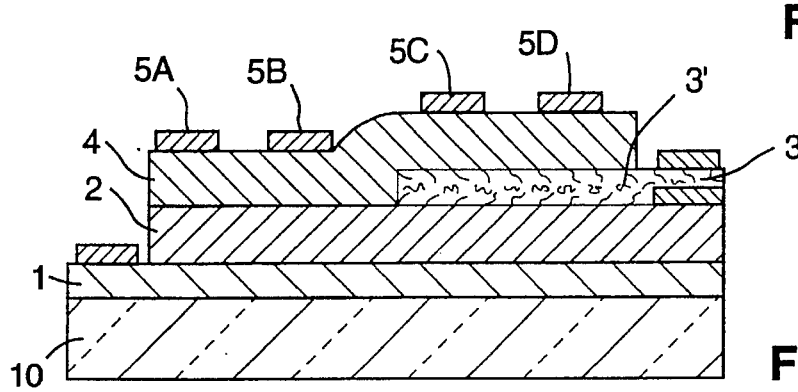
FIG. 16 is a schematic, not-to-scale cross sectional view of a polymer grid triode described in Example 9.

A polymer grid triode in the general configuration of FIG. 1 and the more specific configuration of FIG. 16 was fabricated using the following materials for the indicated layers and constituents:

Substrate: Glass

1st electrode (1): ITO

First active electronic material (2): 1000 Å of poly(phenylene vinylene), (PPV). The PPV-precursor polymer PPV was cast directly onto the ITO electrode. The precursor was converted to the semiconducting PPV form using standard procedures well-known in the art (heating to 220° C. for a period of 2 hours).

Polymer grid electrode (3): Polyaniline filled with MEH-PPV (3'); the filled network was made in a single step using an initial PANI:PE blend containing 40% PANI. The filled network was fabricated directly onto the PPV first active electronic material layer (2) using the method described in Example 1. A gold contact was applied.

Third active electronic material (4): MEH-PPV (1400 Å) was cast onto the filled network, (3) and (3').

Figure 17:
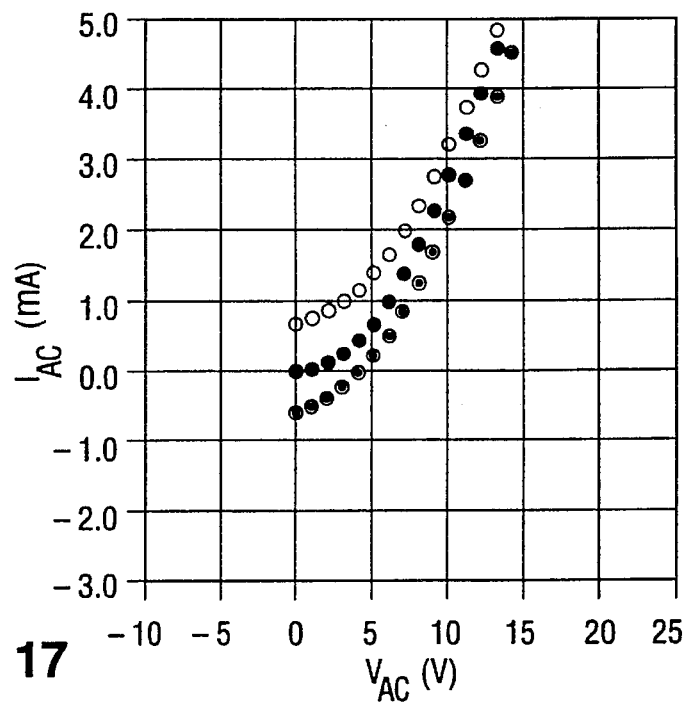
FIG. 17 is a series of graphs of the polymer grid triode cathode (C) current vs voltage ($I_{AC}$ vs $V_{AC}$) curves for the polymer grid triode of FIG. 16 at different voltages between the anode and the polymer grid electrode.

2nd electrode (5): Gold (Au) metal was deposited onto the third layer by vacuum evaporation. The device was connected such that forward anode-cathode bias corresponds to the anode (1) positive with respect to the Au (5). The conducting polyaniline network polymer grid electrode was electrically connected to an external battery circuit such that a voltage was applied between the conducting network and the electrode on the substrate (the anode). The anode-cathode current vs voltage curves ($I_{AC}$ vs $V_{AC}$) are shown for different voltages between the anode and the polymer grid electrode in FIG. 17.

Since electron injection from the Au electrode was negligible, this polymer grid triode was a single-carrier device. The polymer grid triode functioned as a three-terminal device; the anode-cathode current was controlled by the voltage between the anode and the polymer grid electrode.

Similar results were obtained with different series resistance values in the polymer grid circuit (1MΩ or 100KΩ). Thus, the three-terminal device can be operated with the polymer grid biased at constant voltage or with the polymer grid drawing significant grid current.

Figure 18:
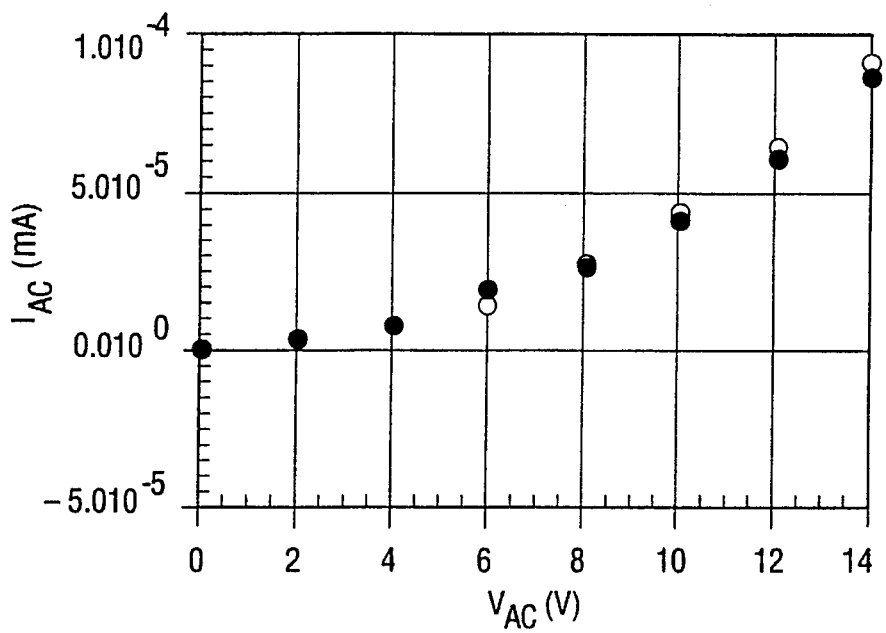
FIG. 18 is a pair of graphs showing the anode to cathode current ($I_{AC}$ vs $V_{AC}$) is independent of the voltage between the polymer grid network when measured at a different position in the device of FIG. 16, a position not affected by the polymer grid.

Note that in the control experiment, the results of which are illustrated in FIG. 18, (using second electrode A, rather than second electrode C; see FIG. 16) the anode-to-cathode current was not affected by the grid-to-anode voltage. This control experiment directly verifies the importance of the polymer grid electrode (the filled PANI network) in the operation as a three-terminal device.

This Example demonstrates that the polymer grid triode functioned as a three-terminal device; that the anode-cathode current was controlled by the voltage between the anode and the polymer grid electrode, and that the role of the polymer grid electrode was critical to the operation, indicative of a three-terminal device.

Example 10

Figure 19:
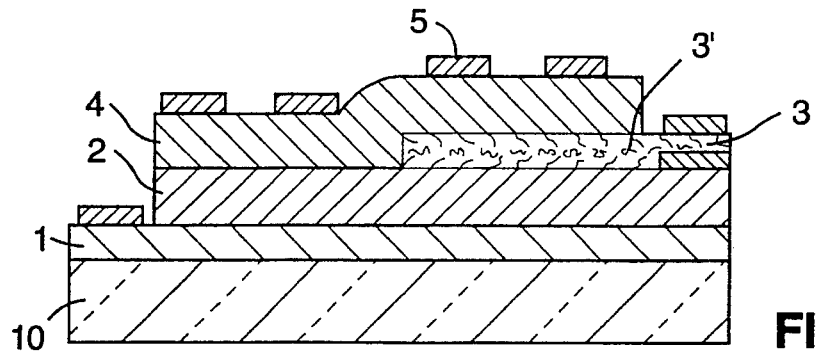
FIG. 19 is a schematic, not-to-scale cross sectional view of a polymer grid triode described in Example 10.

A polymer grid triode in the general configuration of FIG. 1 and the more specific configuration of FIG. 19 was fabricated using the following materials for the indicated layers and constituents:

Substrate: Glass

1st electrode (1): ITO

First active electronic material (2): Poly(vinyl carbazole), PVK. The PVK film (1500 Å) was cast from cyclopentanone directly onto the ITO electrode.

Polymer grid electrode (3): Polyaniline filled with MEH-PPV (3'); the filled network was made in a single step using an initial PANI:PE blend containing 10% PANI. The filled network was fabricated directly onto the PVK layer (2) using the method described in Example 1.

Third active electronic material (4): MEH-PPV cast onto the filled network, (3) and (3').

2nd electrode (5): Gold (Au) metal deposited onto the third layer by vacuum evaporation.

Figure 20:
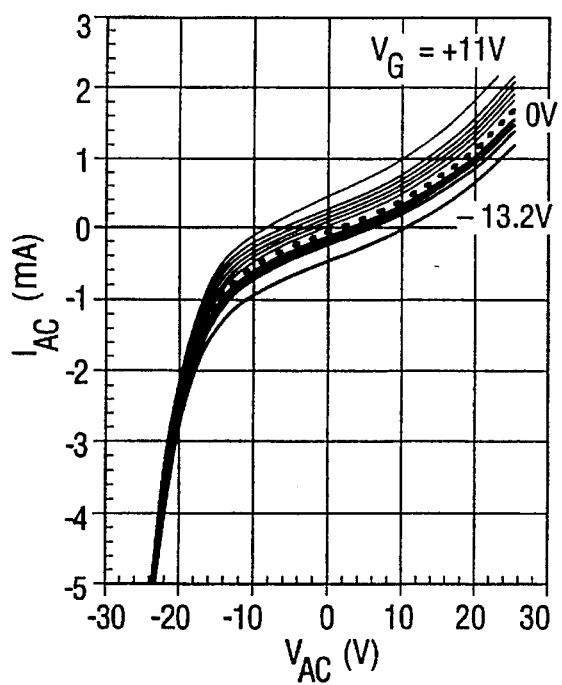
FIG. 20 is a graph of polymer grid triode current-voltage characteristics showing anode (A)—cathode (C) current vs voltage ($I_{AC}$ vs $V_{AC}$) curves for a polymer grid triode of Example 10 for different voltages between the anode and the polymer grid electrode.

The device was connected such that forward anode-cathode bias corresponds to the anode (1) positive with respect to the Au electrode (5). The conducting polyaniline polymer grid electrode (3) was electrically connected to an external battery circuit such that a voltage was applied between the polymer grid electrode and the first electrode (1). The anode-cathode current vs voltage ($I_{AC}$ vs $V_{AC}$) curves are shown for different voltages applied between the anode and the network (3rd) electrode, $V_G$, in FIG. 20.

Figure 21:
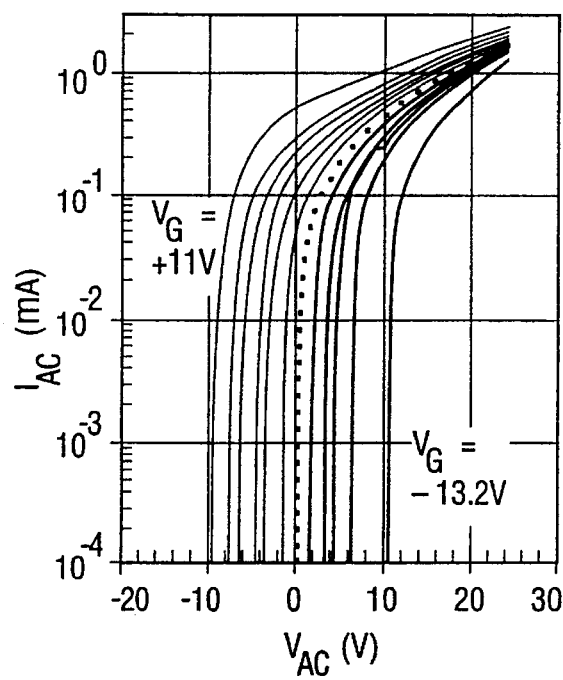
FIG. 21 shows the anode to cathode current ($I_{AC}$ vs $V_{AC}$) for various voltages between the polymer grid and the ITO anode network in the device of Example 10.

The polymer grid triode studied in this Example was a single carrier device, since electron injection from the Au electrode was negligible. The anode-to-cathode current is particularly sensitive to the network (grid) to anode voltage at $V_{AC}$ between ±10 V, where $V_{AC}$ is the voltage applied between the anode and the cathode (positive voltage corresponds to the Au electrode negative with respect to the ITO electrode); see FIG. 21.

Figure 22:
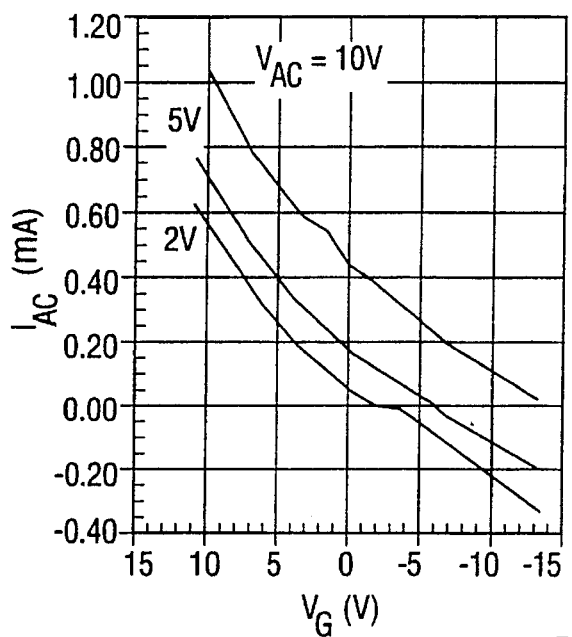
FIG. 22 shows directly the anode-to-cathode current ($I_{AC}$) for the device of Example 10 as a function of the voltage between the network electrode and the anode.

In FIG. 22, the current between anode and cathode ($I_{AC}$) is plotted as a function of the voltage between the polymer grid electrode (3) and the anode (1). Larger negative grid-to-anode voltages suppress the hole current.

Similar results were obtained with different series resistance values in the polymer grid circuit (1MΩ or 100KΩ). Thus, the three-terminal device can be operated with the polymer grid biased at constant voltage or with the polymer grid drawing significant grid current.

This Example demonstrates that the polymer grid triode functioned as a three-terminal device; the anode-cathode current was controlled by the voltage between the anode and the polymer grid electrode.

Example 11

A polymer grid triode in the configuration of FIG. 1 was fabricated using the following materials for the indicated layers and constituents:

Substrate: Glass

1st electrode (1): ITO

First active electronic material (2): Poly(vinyl carbazole), PVK. The PVK film (1500 Å) was cast from cyclopentanone directly onto the ITO electrode.

Polymer grid electrode (3): Polyaniline filled with MEH-PPV (3'); the filled network was made in a single step using an initial PANI:PMMA blend containing 5% PANI using toluene as the solvent. The filled network was fabricated directly onto the PVK active layer (2) using the method described in Example 1.

Third active electronic material (4): MEH-PPV was cast onto the filled network (3) and (3').

2nd electrode (5): Gold (Au) metal was deposited onto the third layer by vacuum evaporation.

Figure 23:
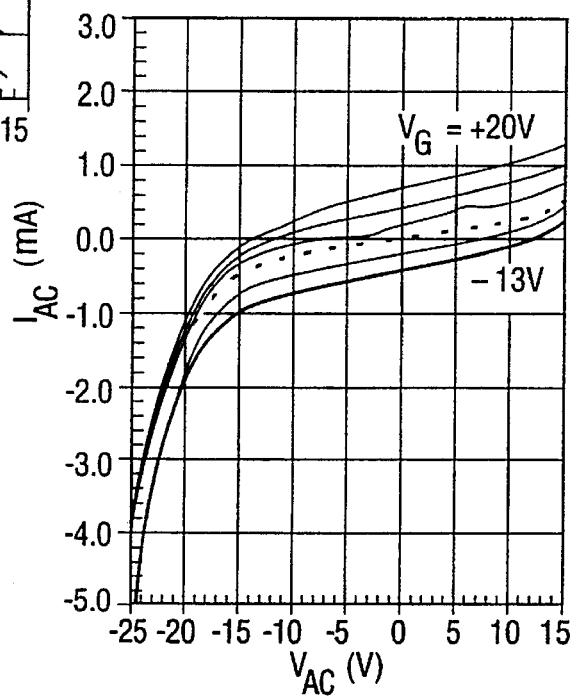
FIG. 23 illustrates polymer grid triode current-voltage characteristics showing anode (A)—cathode (C) current vs voltage ($I_{AC}$ vs $V_{AC}$) curves for a polymer grid triode of Example 11 for different voltages between the anode and the polymer grid electrode.

The device was connected such that forward anode-cathode bias corresponds to the anode (1) positive with respect to the Au electrode (5). The conducting polyaniline polymer grid electrode (3) was electrically connected to an external battery circuit such that a voltage was applied between the polymer grid and (1). The anode-cathode current vs voltage curves ($I_{AC}$ vs $V_{AC}$) are shown for different voltages between the anode and the polymer grid electrode in FIG. 23.

The polymer grid triode studied in this Example was a single carrier device, since electron injection from the Au electrode was negligible. The anode-to-cathode current was particularly sensitive to the polymer grid (3) to anode (1) voltage, $V_G$, at $V_{AC}$ between ±10 V, where $V_{AC}$ is the voltage applied between the anode and the cathode (positive voltage corresponds to the Au electrode negative with respect to the ITO electrode).

Figure 24:
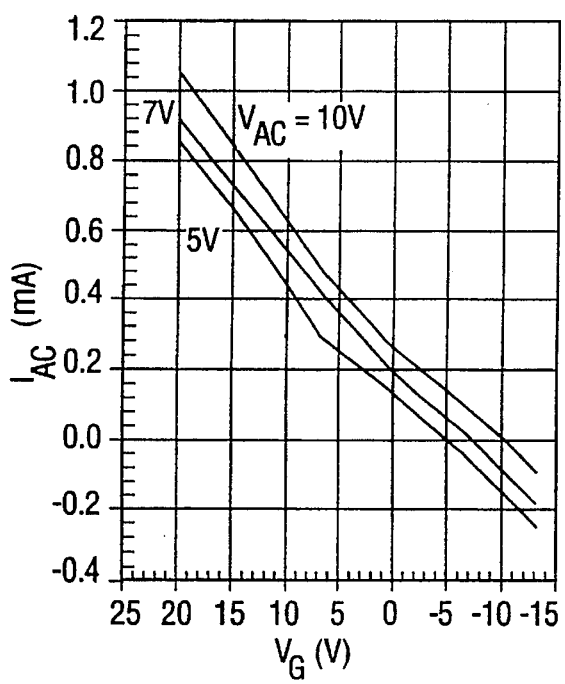
FIG. 24 directly presents the anode-to-cathode current ($I_{AC}$) as a function of the voltage between the network electrode and the anode in the device of Example 11.

In FIG. 24, the current between anode and cathode ($I_{AC}$) is plotted as a function of the voltage between the polymer grid electrode (3) and the anode (1). Larger negative grid to anode voltages ($V_G$) suppress the hole current.

Similar results were obtained with different series resistance values in the polymer grid circuit. Thus, the three-terminal device can be operated with the polymer grid biased at constant voltage or with the polymer grid drawing significant grid current.

This Example demonstrates that the polymer grid triode functioned as a three-terminal device; the anode-cathode current was controlled by the voltage between the anode and the polymer grid electrode. The Example also demonstrates that different blends can be used to fabricate the porous PANI network (PMMA in Example 11 and PES in Example 10).

Example 12

Figure 25:
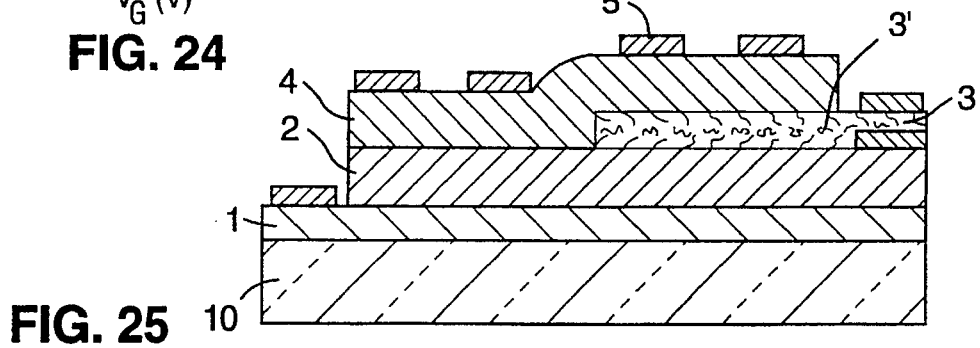
FIG. 25 is a schematic, not-to-scale cross sectional view of a light-emitting polymer grid triode described in Example 12.

A polymer grid light-emitting triode in the general configuration of FIG. 1 and the more specific configuration of FIG. 25 was fabricated using the following materials for the indicated layers and constituents:

Substrate: Glass

1st electrode (1): ITO

First active electronic material (2): Poly(vinyl carbazole), PVK. The PVK film (1000 Å) was cast from cyclopentanone directly onto the ITO electrode.

Polymer grid electrode (3): Polyaniline filled with MEH-PPV (3'); the filled network was made in a single step using an initial PANI:PMMA blend containing 5% PANI using toluene at the solvent. The filled network was fabricated directly onto the PVK second active electronic material layer (2) using the method described in Example 1.

Third active electronic material (4): MEH-PPV cast onto the filled network, (3) and (3')

2nd electrode (5): Calcium (Ca) metal was deposited onto the third layer by vacuum evaporation.

The device was connected such that forward anode-cathode bias corresponds to the anode (1) positive with respect to the Ca cathode (5). The conducting polyaniline network polymer grid electrode (3) was electrically connected to an external battery circuit such that a voltage was applied between the conducting network and the ITO electrode (1).

Figure 26:
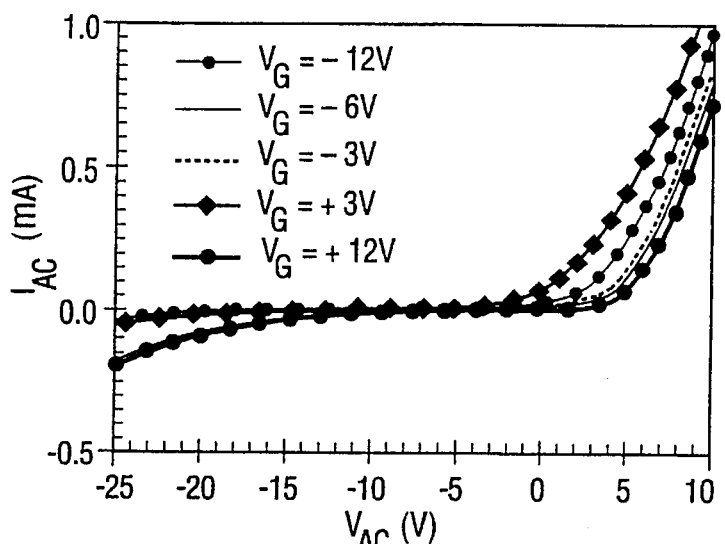
FIGS. 26–28 are a series of graphs based on data gathered in Example 12.

The anode-cathode current vs voltage ($I_{AC}$ vs $V_{AC}$) curves are shown for different voltages ($V_G$) between the anode and the polymer grid electrode in FIG. 26. The data in FIG. 26 demonstrate control of the anode-to-cathode current by the application of a voltage between the polymer grid and the anode. FIG. 26 demonstrates that the structure functions as a three-terminal device.

Figure 27:
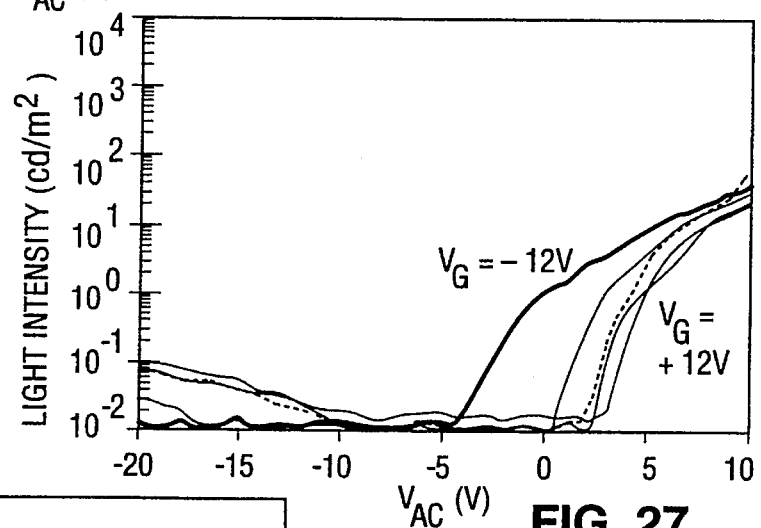
Figure 28:
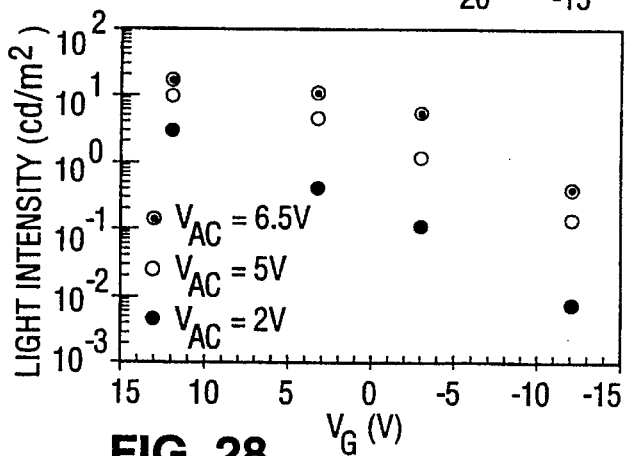

FIG. 27 shows the light emitted from the polymer grid triode as a function of the anode-to-cathode voltage ($V_{AC}$) for several different grid-anode bias voltages ($V_G$). The light emitted was controlled by the grid voltage. This control is shown directly in FIG. 28, where the light emitted at constant $V_{AC}$ (for $V_{AC}$=2 V, 5 V and 6.5 V) is plotted as a function of $V_G$. FIG. 28 demonstrates that the emitted light level can be varied by more than two orders of magnitude by changes in the polymer grid voltage.

When the polymer grid is biased positive with respect to the anode, a potential well for electrons was formed, since the electron energy is minimum when the electrons are near the polymer grid electrode. This potential well served to control the balance between the electron and hole currents and thereby increase the performance of the light-emitting triode.

Similar results were obtained with different series resistance values in the polymer grid circuit (1MΩ or 100KΩ; the resistance from anode to cathode was approximately 100KΩ). Thus, the three-terminal device can be operated with the polymer grid biased at constant voltage or with the polymer grid drawing significant grid current.

This Example demonstrates the polymer grid light-emitting triode; the intensity (brightness) of the emission is controlled by the voltage applied between the polymer grid and the anode. The Example also shows that the biasing of the polymer grid served to control the balance between the electron and hole currents and thereby increase the performance of the light-emitting triode.

Example 13

Figure 29:
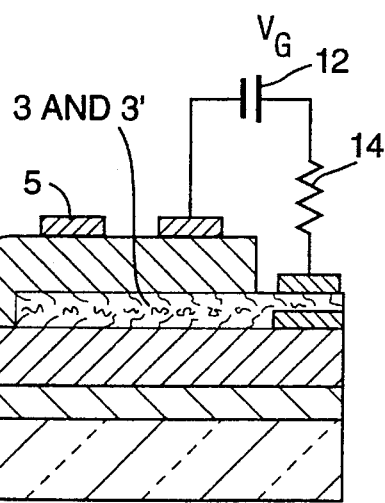
FIG. 29 is a schematic, not-to-scale cross sectional view of a light-emitting polymer grid triode described in Example 13.

A polymer grid triode in the general configuration of FIG. 1 and the more specific configuration of FIG. 29 was fabricated using the following materials for the indicated layers and constituents:

Substrate: Glass

1st electrode (1): ITO

First active electronic material (2) Poly(vinyl carbazole), PVK. The PVK film (1500 Å) was cast from cyclopentanone directly onto the ITO electrode.

Polymer grid electrode (3): Polyaniline filled with MEH-PPV (3'); the filled network was made in a single step using an initial PANI:PES blend containing 40% PANI. The filled network was fabricated directly onto the PVK first active electronic material layer (2) using the method described in Example 1.

Third active electronic material (4): MEH-PPV cast onto the filled network, (3) and (3').

2nd electrode (5): Gold (Au) metal deposited onto the third layer by vacuum evaporation.

Figure 30:
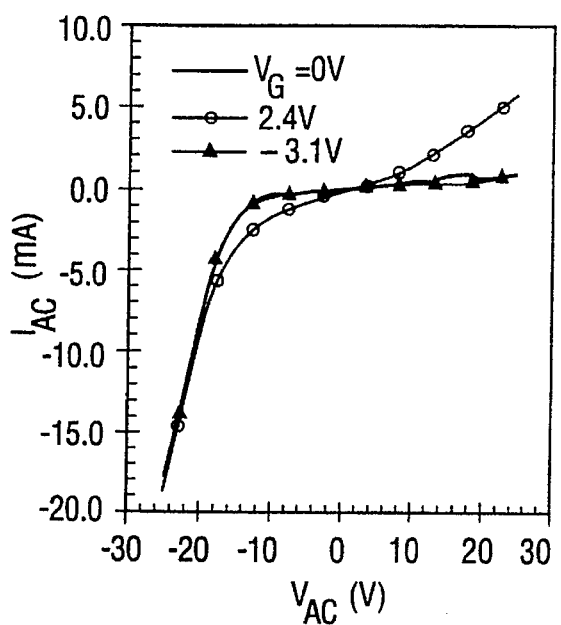
FIG. 30 is a series of graphs based on data gathered in Example 13 which shows the anode (A)—cathode (C) current vs voltage ($I_{AC}$ vs $V_{AC}$) curves for different voltages ($V_G$) between the anode and the polymer grid electrode in the light-emitting triode of FIG. 27.

The device was connected such that forward anode-cathode bias corresponds to the anode (1) positive with respect to the Au electrode (5). The conducting polyaniline polymer network electrode was electrically connected to an external battery circuit such that a voltage was applied between the polymer grid and the electrode opposite to the substrate (5). The anode-cathode current vs voltage curves ($I_{AC}$ vs $V_{AC}$) are shown for different voltages between the anode and the polymer grid electrode in FIG. 30.

The polymer grid triode studied in this Example was a single carrier device, since electron injection from the Au electrode was negligible. The anode-to-cathode current was particularly sensitive to the polymer grid (3) to Au (5) voltage.

Similar results were obtained with different series resistance values in the polymer grid circuit (1MΩ or 100KΩ; the resistance from anode to cathode was approximately 100KΩ). Thus, the three-terminal device can be operated with the polymer grid biased at constant voltage or with the polymer grid drawing significant grid current.

This Example demonstrates that the polymer grid triode functioned as a three-terminal device; the anode-cathode current was controlled by the voltage between the electrode opposite to the substrate (5) and the polymer grid electrode.

Example 14

A polymer grid triode in the configuration of FIG. 1 was fabricated using the following materials for the indicated layers and constituents:

Substrate: Glass

1st electrode (1): ITO

First active electronic material (2) Poly(vinyl carbazole), PVK. The PVK film (1500 Å) was cast from cyclopentanone directly onto the ITO electrode.

Polymer grid electrode (3): Polyaniline filled with PMMA (3'); in this Example, the PMMA was not removed from the PANI:PMMA blend. The filled network blend was fabricated directly onto the PVK first active electronic material layer (2) using the method described in Example 1.

Third active electronic material (4): MEH-PPV cast onto the filled network, (3) and (3').

2nd electrode (5): Calcium (Ca) metal deposited onto the third layer by vacuum evaporation.

Figure 31:
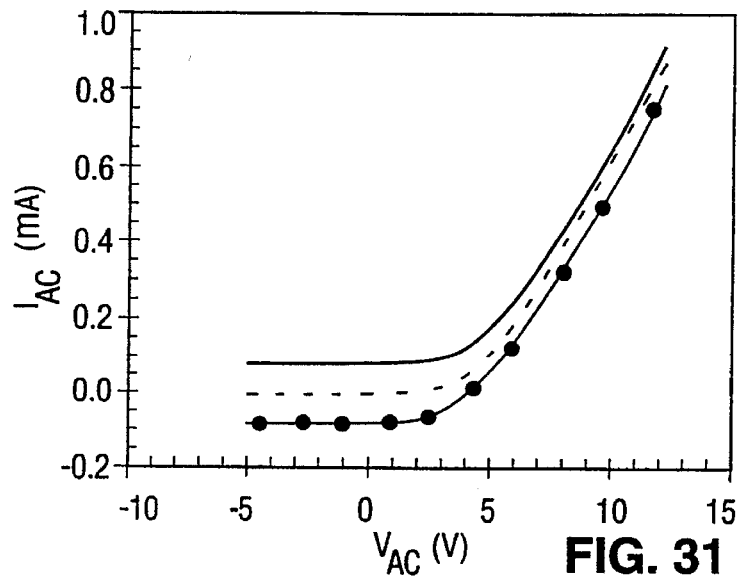
FIG. 31 is a series of graphs based on data gathered in Example 14 which shows the anode (A)—cathode (C)

The $I_{AC}$ vs $V_{AC}$ curves are plotted in FIG. 31a for various voltages applied to the PANI grid electrode (filled with PMMA). $I_{AC}$ vs $V_{AC}$ curves are plotted in FIG. 32 for a similar device but with the PMMA removed and replaced by MEH-PPV (in a single step) using toluene as the solvent. Although the I–V characteristics are similar for the two devices, leaving the PMMA in the grid resulted in reduced sensitivity to the grid voltage.

This example demonstrates the importance of removing the host polymer from the PANI:host blend so as to provide better contact of the PANI network to the active electronic material.

Example 15

A polymer grid light-emitting triode in the configuration of FIG. 1 was fabricated using the following materials for the indicated layers and constituents:

Substrate: Glass

1st electrode (1): ITO

First active electronic material (2) Poly(vinyl carbazole), PVK. The PVK film (1000 Å) was cast from cyclopentanone directly onto the ITO electrode.

Polymer grid electrode (3): Polyaniline (100%). The 100% PANI layer was cast directly onto the PVK first active electronic material layer (2).

Third active electronic material (4): MEH-PPV cast onto the 100% PANI grid, (3).

2nd electrode (5): Calcium (Ca) metal deposited onto the third layer by vacuum evaporation.

The device was connected such that forward anode-cathode bias corresponds to the anode (1) positive with respect to the Ca cathode (5). The conducting polyaniline network polymer grid electrode (3) was electrically connected to an external battery circuit such that a voltage was applied between the conducting network and the ITO electrode (1).

The device described in this Example was in every way similar to that described in Example 12 with a single exception: in this Example 15, the grid electrode was 100% PANI while in Example 12, the polymer grid electrode was a PANI network filled with MEH-PPV.

The $I_{AC}$ vs $V_{AC}$ and light output vs $V_{AC}$, for various $V_G$, are shown in FIGS. 33 and 34 respectively. Note that with 100% PANI as the polymer grid electrode, the $I_{AC}$ vs $V_{AC}$ curves and the light output vs $V_{AC}$ curves are relatively insensitive to $V_G$.

This Example demonstrates the importance of the high surface area, electric field enhancing PANI network in contact with the active electronic material (MEH-PPV in this Example).

Example 16

A polymer grid triode in the configuration of FIG. 1 was fabricated using the following materials for the indicated layers and constituents:

Substrate: Glass
1st electrode (1): Gold (Au)
First active electronic material (2):
Poly (vinyl carbazole), PVK. The PVK film (≈1000 Å) was cast from meta-cresol directly onto the Au (on glass) electrode.
Polymer grid electrode (3): Polyaniline filled will MEH-PPV (3'); the filled network was made in a single step using an initial PANI:PES blend containing 25% PANI. The filled network was fabricated directly onto the PVK first active electronic material layer (2) using a method described in Example 1.
Third active electronic material (4): MEH-PPV cast onto the filled network, (3) and (3'). 2nd electrode (5): Gold (Au) metal deposited onto the third layer by vacuum evaporation.

Because of the built-in potentials, Au more electronegative than PANI, this configuration is analogous to a pnp-transistor.

The experimental results are summarized in FIG. 35; $I_{AC}$ vs $V_{AC}$ curves are plotted at $V_G=0$ (zero grid current) and at $V_G=0.07$ V with $I_G=0.1$ mA. The effect of the grid current on $I_{AC}$ is evident at all $V_{AC}$ bias levels.

Note that the grid to anode resistance was approximately 700 ohms, while the anode to cathode resistance under forward bias ($V_{AC}=8$ V) was approximately 30,000 ohms. Thus, the PVK layer dominated the anode to cathode current ($I_{AC}$).

The data summarized in FIG. 35 indicate that current in the external circuit can be switched by the device; application of 0.1 mA grid current ($I_G$) results in an increase in $I_{AC}$ by significantly more than 0.1 mA; the change in $I_{AC}$ is 0.17 mA at V=8 V, nearly a factor of two greater than the input grid current. Because the current was limited by the high series resistance of the PVK layer, the data indicated that higher current would be switched by using a conjugated polymer layer (such as P3OT or PPV) as the first electronically active material (2).

Using this polymer grid triode in an external circuit with a series resistor ($R_S$) in the anode circuit resulted in voltage gain. For example, with $R_S=10,000$ ohms, the change in the voltage across $R_S$ was 1.7 volts. Since the applied $V_G$ was 0.07 V, the voltage gain was ≈25.

This Example demonstrates that polymer grid triodes operate as three terminal devices, analogous to pnp transistors. The Example demonstrates both current gain and voltage gain from polymer grid triode devices.

Example 17

An Al/MEH-PPV/PANI-CSA/MEH-PPV/Ca Polymer Grid triode was fabricated. The Al anode was first vacuum deposited onto a glass substrate. The first MEH-PPV layer was then spin-cast from solution in xylene. To make the polymer grid, the PANI-CSA blends were spin-cast directly onto the first MEH-PPV layer. To fabricate the filled network grid electrode, MEH-PPV was spin-cast at 1000 rpm from solution in xylene directly onto the thin film of the PANI:PES blend. Since xylene is an excellent solvent for PES, the PES in the PANI:PES blend was etched out by the xylene and subsequently carried away by the excess MEH-PPV solution during the spin-casting process. Hence, in a single step, MEH-PPV replaced PES to fill (or partially fill) the voids in the porous structure within the PANI:PES network. The MEH-PPV layer extended beyond the filled network to form the third active electronic material, layer (4) in FIG. 1.

The polymer grid triode device was completed by vacuum deposition of the thin metallic cathode film by vapor deposition. The polymer grid triode thus had continuous semi-conducting polymer between anode and cathode with the PANI-CSA grid network in a thin layer within the polymer semiconductor.

The $I_{AC}$ VS $V_{AC}$ characteristics of an Al/MEH-PPV/PANI-CSA/MEH-PPV/Ca polymer grid TFT are shown in FIG. 36 for various grid voltages, $V_G$, applied between the PANI-CSA network grid and the Al cathode. In this case, the PANI-CSA grid was fabricated from a 3% PANI-CSA:PES blend, so the network is relatively dilute. For $V_G=0$, the $I_{AC}$ vs $V_{AC}$ curve is like that of a diode; current flows when the Al cathode is biased negative with respect to the Ca anode. The Al/MEH-PPV/Ca configuration is a single carrier (electron-only) device; electrons are injected at the Al electrode and withdrawn at the Ca electrode. As the PANI grid is made more and more negative with respect to the Al and Ca electrodes ($V_G$ negative), the electron current is suppressed. For example, with $V_G=-9.7$ V, $I_{AC}=0$ until the magnitude of $V_{AC}$ exceeds 10 V. More generally, we find that with $V_G=-V_o$, $I_{AC}=0$ until the magnitude of $V_{AC}$ exceeds (approximately) $V_o$.

When $V_G>0$, however, the injected electrons are withdrawn at the positively biased PANI-CSA grid. In addition, under such forward bias conditions for the PANI-CSA/MEH-PPV/Ca diode, holes are injected at the PANI-CSA/MEH-PPV interface. In fact, as would be expected for $V_G$ positive (i.e. PANI-CSA positive with respect to Ca), the PANI-CSA/MEH-PPV/Ca diode emits light. This emission has been characterized in detail in a series of separate experiments using ITO/MEH-PPV/PANI-CSA/MEH-PPV/Ca polymer grid triodes (the transparent ITO facilitates the detection of the emitted light).

Qualitatively, the $I_{AC}$ vs $V_{AC}$ characteristics shown in FIG. 36 are consistent with the electronic structure diagrams of FIG. 2. For $V_G<0$, electrons which are injected at the Al cathode pass through the PANI-CSA grid and are collected at the Ca electrode as long as $|V_{AC}|>|V_G|$. Thus, the PANI-CSA network is sufficiently dilute to allow electron current to flow and to function as a control grid.

Independent measurements of the I vs V curves for the Al/MEH-PPV/PANI-CSA half of the device and for the PANI-CSA/MEH-PPV/Ca half of the device show that both exhibit the expected diode behavior. The data are shown in FIG. 37. Although the rectification ratios are moderate (<100), both the Al/MEH-PPV/PANI-CSA half and the PANI-CSA/MEH-PPV/Ca half yield diode-like I–V curves.

The electronic structure diagrams of FIG. 2 imply that $I_{AC}$ will begin to flow when the PANI-CSA/MEH-PPV/Ca is in the flat band condition. FIG. 38 shows that for successively higher values of $|V_G|$, the steep onset of $I_{AC}$ (which defines the flat band condition) moves to proportionally to higher values of $|V_{AC}|$. Again, the results are as expected from the electronic structure diagrams sketched in FIG. 2.

FIG. 39 shows the current gain, $G=\Delta I_{AC}/\Delta I_G$, of an Al/MEH-PPV/PANI/MEH-PPV/Ca device, where $\Delta I_G$ is the change in grid current and $\Delta I_{AC}$ is the corresponding change in current in the anode-to-cathode circuit. The polymer grid triode used to obtain the data shown in FIG. 39 contained a PANI-CSA network grid fabricated from a blend with initial PANI-CSA concentration of 3%. An external AC signal (5 v peak-to-peak) was applied in the grid circuit with the grid biased at $V_G=-7.5$ V(DC) and $V_{AC}=-12$ V; the test circuit is shown in FIG. 40. As a result, AC current flowed into the grid circuit (and was directly measured by an ammeter connected to the grid), thereby modulating the grid voltage. The resulting change in $I_{AC}$ determined the gain.

As shown in FIG. 39, at low frequencies $G \approx 4.5$, consistent with estimates based on the change in the dc characteristics at different $V_G$. Upon increasing the modulation frequency, f, the gain is observed to fall to one-half the low frequency value at f≈400 Hz ($\omega \approx 2.4 \times 10^3$ rad/s), indicating a response time $\tau \approx 4 \times 10^{-4}$ s.

The high frequency response shown in FIG. 39 is limited by the RC time constant of the device. The input resistance to the PANI-CSA grid is determined by the resistance of the PANI-CSA network; $R_n = \rho_n L/Ld$, where $\rho_n$ is the resistivity of the network, and L and d are, respectively, the length (lateral dimension) and thickness of the device. The capacitance is determined by the thin film ("capacitor") geometry, $C=\epsilon_s A/d=\epsilon_s L^2/d$ (assuming a square device) where $\epsilon_s$ is the dielectric constant of the semiconductor. Thus $$\tau_{RC}=RC=\rho_n\epsilon_s(L/d)^2.$$

The measured values of $R_n$ and C are consistent with the high frequency cut-off shown in FIG. 39. Since the dimensions of the devices fabricated in this initial study were of order 0.5 cm, reduction of the device dimensions would increase the RC-limited frequency response; for example, by decreasing the lateral dimensions to 10 μm, $1/\tau_{RC} > 10^8$ Hz.

The theoretical limit for the high frequency cutoff can be simply estimated from the mobility of the semiconducting polymer. To obtain significant gain, carriers must move through the grid in a time comparable with the period of the ac signal. The carrier velocity is given by $2 \mu V_G/d$, where μ is the mobility and d is the thickness of the device (e.g. 2000 Å). Thus, the intrinsic response time, $\tau_i$, (i.e. that limited by the mobility of the semiconducting polymer) is given by $$\tau_i \approx d^2/\mu V.$$

Assuming $\mu \approx 10^{-4}$ cm$^2$/V–s for the disordered polymer film cast from solution and taking $V_G=5$ V, we estimate $\tau \approx 10^{-6}$ s. This short response time is a direct result of the thin film architecture of the polymer grid triode. The implied high frequency response is quite remarkable for a transistor-like device made with such a low mobility material.

Higher gain can be achieved by improving the rectification ratios of the back-to-back diodes, by making the overall structure (and the component layers) thinner, and by optimizing the concentration of PANI-CSA in the network for optimum transmission of carriers through the network grid and for optimum input resistance to the grid.

This example demonstrates that polymer grid triodes can be fabricated by processing the component materials from solution. The polymer network grid can be used to control the current flow from anode-to-cathode, thereby creating a new class of transistor-like devices which exhibit current gain (and voltage gain).

We claim the following:

1. A polymer grid comprising a body of electrically conducting organic polymer, said body having an open and porous network morphology and defining an expanded surface area void-defining porous network and active electronic material located within a least a portion of the void spaces defined by the porous network, said active electronic material comprising an organic semiconducting polymer or organic semiconducting low molecular weight organic oligomeric material selected from the group consisting of oligomers of thiophene, pyrrole, phenylene, phenylene vinylene and derivatives thereof.

2. The polymer grid of claim 1 wherein the conducting organic polymer comprises conducting polypyrolle or polyaniline.

3. The polymer grid of claim 2 wherein the conducting organic polymer comprises polyaniline in the conducting, protonated emeraldine salt form.

4. The polymer grid of claim 1 wherein the active electronic material comprises nonconjugated organic polymer.

5. The polymer grid of claim 1 wherein the active electronic material comprises conjugated organic polymer.

6. The polymer grid electrode of claim 1 wherein the active electronic material is a low molecular weight semiconducting oligomeric material selected from the group consisting of oligomers of thiophene, pyrrole, phenylene, phenylene vinylene and derivative thereof.

7. The polymer grid of claim 1 wherein the expanded surface area is a surface area greater than 10 cm$^2$/gram and the void space is at least 1% by volume.

8. The polymer grid of claim 1 wherein the thin film.

9. The polymer grid of claim 8 wherein the thin film is less than 200 nanometers thick.

10. A polymer grid electrode comprising a body of electrically conducting organic polymer, electrically joined to an electrical connector, said body having an open and porous network morphology and defining an expanded surface area void-defining porous network and active electronic material located within a least a portion of the void spaces defined by the porous network, said active electronic material comprising an organic semiconducting polymer or organic semiconducting low molecular weight organic oligomeric material selected from the group consisting of oligomers of thiophene, pyrrole, phenylene, phenylene vinylene and derivatives thereof.

11. The polymer grid electrode of claim 10 wherein the conducting organic polymer comprises polypyrolle or polyaniline.

12. The polymer grid electrode of claim 11 wherein the conductive organic polymer comprises polyaniline in the conducting, protonated emeraldine salt form.

13. The polymer grid electrode of claim 10 wherein the expanded surface area is a surface area greater than 10 cm$^2$/gram and the void space is at least 1% by volume.

14. A solid state polymer grid triode comprising a first electrode and a second electrode spaced apart from one another with a polymer grid comprising a body of electrically conducting organic polymer said body having an open and porous network morphology and defining an expanded surface area void-defining porous network interposed between the first electrode and the second electrode.

15. The polymer grid triode of claim 14 wherein the conducting organic polymer comprises conducting polypyrolle or polyaniline.

16. The polymer grid triode of claim 14 wherein the conducting organic polymer comprises polyaniline in the conducting, protonated emeraldine salt form.

17. The polymer grid triode of claim 14 wherein the expanded surface area is a surface area greater than 10 $cm^2/gram$ and the void space is at least 1% by volume.

18. The polymer grid triode of claim 14 wherein the body is a thin film having a thickness such that the total distance between the first electrode and the second electrode is less than a micron.

19. The polymer grid triode of claim 14 additionally comprising active electronic material between at least one of the first and second electrodes and the polymer grid.

20. The polymer grid triode of claim 14 additionally comprising active electronic material selected from organic and inorganic semiconductors located within at least a portion of the void spaces defined by the porous network.

21. The polymer grid triode of claim 20 additionally comprising active electronic material between at least one of the first and second electrodes and the polymer grid.

22. The polymer grid triode of claim 21 wherein the active electronic material within the voids and the active electronic material between the electrodes are the same.

23. The polymer grid triode of claim 21 wherein the active electronic material within the voids and the active electronic material between the electrodes are different.

24. The polymer grid triode of claim 21 wherein the active electronic material between at least one of the first and second electrodes and the polymer grid comprises semiconducting polyaniline, polyaniline in the conducting protonated emeraldine salt form, semiconducting polypyrrole or polypyrrole in the oxidized conducting form.

25. The polymer grid triode of claim 21 wherein of the active material comprises a conjugated semiconducting organic polymer or a nonconjugated semiconducting organic polymer.

26. The polymer grid triode of claim 25 wherein the active material is selected from the group consisting of poly(paraphenylene vinylene); a soluble derivative of poly(paraphenylene vinylene); poly(thiophene); a soluble derivative of poly(thiophene) and a low molecular weight semiconducting oligomer of thiophene, pyrrole, phenylene, or phenylene vinylene.

27. The polymer grid triode of claim 21 herein active electronic material is present between the first electrode and the polymer grid.

28. The polymer grid triode of claim 27 wherein the active electronic material comprises a semiconducting organic polymer.

29. The polymer grid triode of claim 27 wherein the active electronic material comprises a semiconducting hole transport material.

30. The polymer grid triode of claim 27 wherein the active electronic material comprises PVK.

31. The polymer grid triode of claim 27 wherein the active electronic material is present between the second electrode and the polymer grid.

32. The polymer grid triode of claim 31 wherein the active electronic material within the voids and the active electronic material between the electrodes are the same.

33. The polymer grid triode of claim 31 wherein the active electronic material within the voids and the active electronic material between the electrodes are different.

34. The polymer grid triode of claim 31 wherein the active electronic material between the electrodes comprises a semiconducting electron transport material.

35. The polymer grid triode of claim 31 wherein the active electronic material between the electrodes is part of a bilayer, which bilayer comprises a layer of active electronic material and a second polymer grid comprising a second body of electrically conducting organic polymer, said second body having an open and porous network morphology and defining an expanded surface area void-defining porous network and active electronic material located within at least a portion of the void spaces defined by the porous network the active electronic material in the voids of the second body being different from the active electronic material between the electrodes.

36. The polymer grid triode of claim 35 wherein the active electronic material within the Voids of the second body comprises a semiconducting material.

37. The polymer grid triode of claim 14 additionally comprising a substrate selected from a free standing polymer film, either rigid or flexible, an inorganic glass, amorphous silicon, an inorganic single crystal, single crystal silicon, single crystal quartz, single crystal sapphire, and a metal.

38. The polymer grid triode of claim 14 additionally comprising an electrical connector joined to said body.

39. The polymer grid triode of claim 20 additionally comprising an electrical connector joined to said body.

40. The polymer grid triode of claim 21 additionally comprising an electrical connector joined to said body.

41. The polymer grid triode of claim 35 additionally comprising an electrical connector joined to one of said first and said second bodies.

42. The polymer grid triode of claim 35 in polymer grid tetrode form additionally comprising electrical connectors joined to said first and second bodies.

43. A light-emitting polymer grid triode comprising a first electrode and a second electrode spaced apart from one another with a polymer grid comprising a body of electrically conducting organic polymer said body having an open and porous network morphology and defining an expanded surface area void-defining porous network interposed between the first and second electrodes and active luminescent semiconducting electronic material also interposed between the first and second electrodes which serves to transport electronic charge carriers between the first and second electrodes, the carriers being affected by the polymer grid, such that on applying a turn-on voltage between the first and second electrodes, charge carriers are injected and light is emitted.

44. The light-emitting polymer grid triode of claim 43 wherein active electronic material is located within at least a portion of the void spaces defined by the porous network.

45. The light-emitting polymer grid triode of claim 44 wherein the active electronic material located within at least a portion of the void spaces defined by the porous network is the same as the active luminescent semiconducting electronic material.

46. The light-emitting polymer grid triode of claim 44 wherein the active electronic material located within at least a portion of the void spaces defined by the porous network is different than the active luminescent semiconducting electronic material.

47. The light-emitting polymer grid triode of claim 44 additionally comprising an electrical connector joined to said body and electrically connecting the polymer grid to an external circuit such that a voltage can be applied to the polymer grid electrode and current can be drawn in the grid circuit, either positive or negative, between the polymer grid electrode and one of the other two electrodes so as to function as a three-terminal light emitting triode.

48. The light-emitting polymer grid triode of claim 44 with the turn-on voltage in the forward direction being below 10 V.

49. The light-emitting polymer grid triode of claim 44 wherein the luminescent semiconducting electronic material comprises a low molecular weight semiconducting and/or photoluminescent organic material such as but not limited to the following:

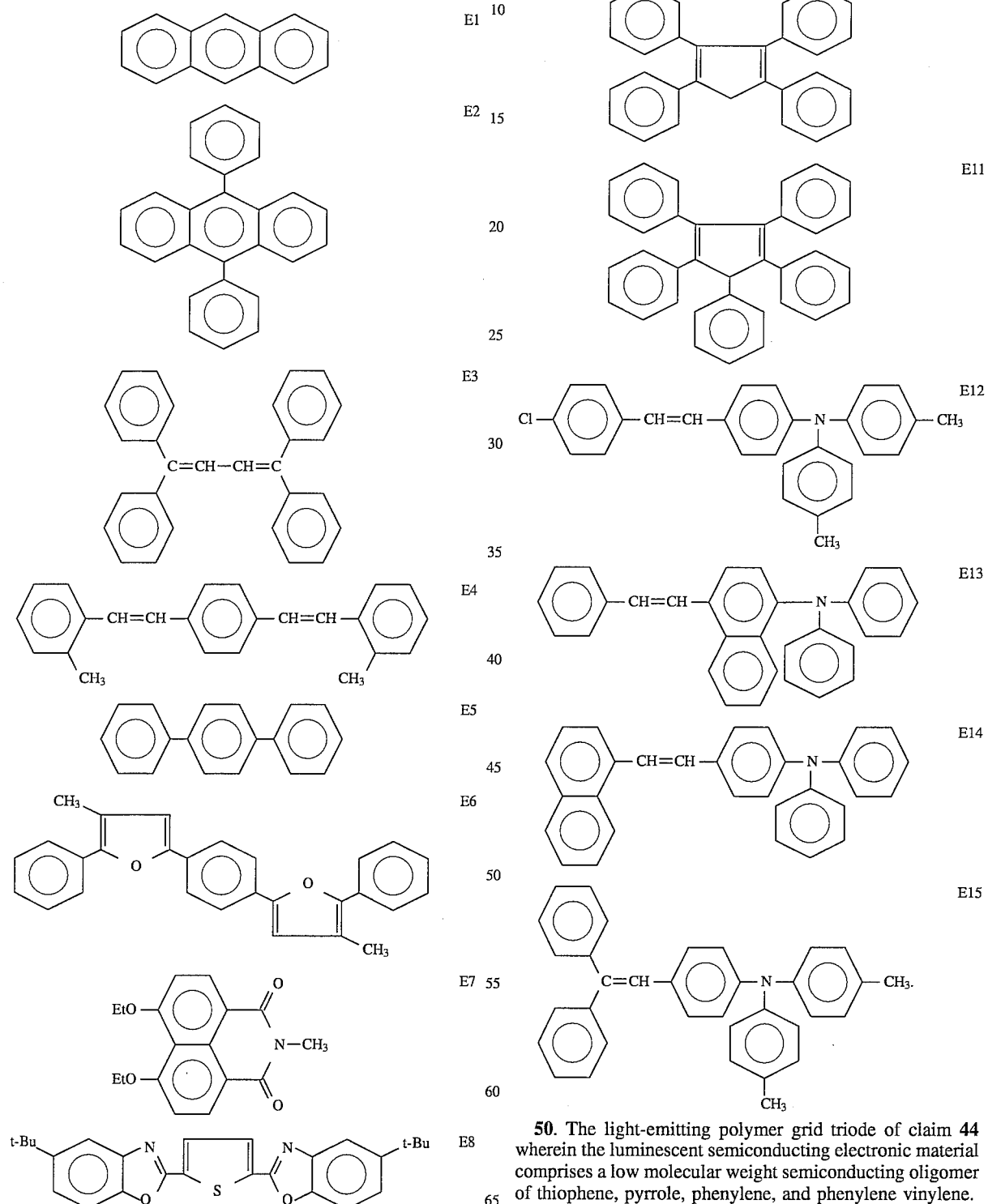

50. The light-emitting polymer grid triode of claim 44 wherein the luminescent semiconducting electronic material comprises a low molecular weight semiconducting oligomer of thiophene, pyrrole, phenylene, and phenylene vinylene.

51. In a circuit in which an electrical current passes between a first electrode and a second electrode separated from one another by an active electronic material capable of transporting electronic charge carriers the improvement comprising an organic polymer grid of claim 1 interposed between said first electrode and said second electrode to affect the active electronic material's transporting of electronic charge carriers.

52. The circuit of claim 51 wherein the current results from single carrier injection.

53. The circuit of claim 51 wherein the current results from two carrier injection; electron injection at the first electrode which serves as a cathode and hole injection at the second electrode which serves as an anode.

54. The circuit of claim 51 wherein the network comprising the polymer grid enhances the local electric field upon the application of a voltage between the first electrode and the second electrode, resulting in enhanced charge carrier injection.

55. The circuit of claim 54 wherein the charge carrier injection is enhanced over that without the polymer grid by at least a factor of 5.

56. The circuit of claim 51 wherein the first active electronic material located within the void spaces is the same as the active electronic material separating the first electrode and the second electrode.

57. The circuit of claim 51 wherein the first active electronic material located within the void spaces differs from the active electronic material separating the first electrode and the second electrode.

58. In a circuit in which an electrical current passes between a first electrode and a second electrode separated from one another by active electronic material capable of transporting electronic charge carriers the improvement comprising a polymer grid electrode of claim 13 interposed between said first electrode and said second electrode, said polymer grid electrode electrically connected to an external grid circuit such that a voltage can be applied to the polymer grid electrode and current can be drawn in the grid circuit, either positive or negative, between the polymer grid electrode and one or both of the first and second electrodes so as to function as a three-terminal polymer grid triode and affect the active electronic material's transporting of electronic charge carriers.

59. The circuit of claim 58 wherein the first and second electrodes are selected to provide rectification with a rectification ratio greater than 10.

60. The circuit of claim 58 wherein gain is achieved.

61. In a circuit in which an electron current passes between an anode and a cathode separated from one another by an active electronic material capable of transporting electronic charge carriers the improvement comprising employing said anode and cathode as elements of the tetrode of claim 42 with the polymer grid electrode electrically connected to an external grid circuit such that a voltage can be applied to the polymer grid electrode and grid current can be drawn in the grid circuit, between the polymer grid electrode and one or both of the anode and cathode so as to affect the active electronic material's transporting of electronic charge carriers and the second body electrically connected to a second external circuit such that a voltage can be applied to the second body such that the two external circuits provide independent control over the electron current and the grid current.

62. A method for producing a polymer grid of claim 1 comprising
 a. forming a blend comprising bicontinuous interpenetrating networks of an electrically conducting polymer and a host polymer, said host polymer being selectively removable,
 b. treating the blend under host polymer-removing conditions thereby selectively removing the host polymer leaving a body of electrically conducting organic polymer, said body having an open and porous network morphology and defining an expanded surface area void-defining porous network and
 c. placing first active electronic material within at least a portion of the void spaces defined by the porous network.

63. The method of claim 62 comprising:
 a. forming a blend comprising bicontinuous interpenetrating networks of an electrically conducting polymer and a host polymer, said host polymer being selectively soluble in a solvent,
 b. contacting the blend with the solvent thereby selectively dissolving the host polymer leaving a body of electrically conducting organic polymer, said body having an open and porous network morphology and defining an expanded surface area void-defining porous network and
 c. placing first active electronic material within at least a portion of the void spaces defined by the porous network.

64. The method of claim 62 wherein steps b. and c., are separate and serial.

65. The method of claim 62 wherein steps b. and c. are simultaneous.

66. The method of claim 63 wherein the blend comprises polyaniline as the conducting polymer.

67. The method of claim 66 wherein the blend comprises low molecular weight polyester resin or polymethylmethacrylate (PMMA) as host polymer.

68. The polymer grid triode of claim 19 wherein the active electronic material between the electrodes is a conductor.

69. The polymer grid triode of claim 19 wherein the active electronic material between the electrodes is a semiconductor.

70. The polymer grid triode of claim 19 wherein the active electronic material between the electrodes is an inorganic material.

71. The polymer grid triode of claim 19 wherein the active electronic material between the electrodes is an organic material.

72. The polymer grid triode of claim 71 wherein the active electronic material between the electrodes comprises polyaniline.

73. The polymer grid triode of claim 71 wherein the active electronic material between the electrodes comprises polyaniline in the conductive emeraldine salt form.

74. The polymer grid triode of claim 21 wherein the active electronic material between the electrodes is a conductor.

75. The polymer grid triode of claim 21 wherein the active electronic material between the electrodes is a semiconductor.

76. The polymer grid triode of claim 21 wherein the active electronic material between the electrodes is an inorganic material.

77. The polymer grid triode of claim 21 wherein the active electronic material between the electrodes is an organic material.

78. The polymer grid triode of claim 77 wherein the active electronic material between the electrodes comprises polyaniline.

79. The polymer grid triode of claim 77 wherein the active electronic material between the electrodes comprises polyaniline in the conductive emeraldine salt form.

80. The polymer grid triode of claim 27 wherein the active electronic material between the electrodes is a conductor.

81. The polymer grid triode of claim 27 wherein the active electronic material between the electrodes is a semiconductor.

82. The polymer grid triode of claim 27 wherein the active electronic material between the electrodes is an inorganic material.

83. The polymer grid triode of claim 27 wherein the active electronic material between the electrodes is an organic material.

84. The polymer grid triode of claim 83 wherein the active electronic material between the electrodes comprises polyaniline.

85. The polymer grid triode of claim 83 wherein the active electronic material between the electrodes comprises polyaniline in the conductive emeraldine salt form.

86. A polymer grid triode with an electronegative metal as the anode and the cathode and with a polymer grid comprising polyaniline in its conducting form and with semiconducting materials between the anode and the polymeric grid, between the cathode and the polymeric grid and within the voids of the polymeric grid, said polymeric grid triode having built-in potentials analogous to a pnp transistor.

87. A polymer grid triode with electropositive metals as the anode and the cathode and with a polymer grid comprising polyaniline in its conducting form and with semiconducting materials between the anode and the polymeric grid, between the cathode and the polymeric grid and within the voids of the polymeric grid, said polymeric grid triode having built-in potentials analogous to an npn transistor.

88. The polymer grid triode of claim 38 wherein the conducting organic polymer comprises conducting polypyrrole or polyaniline.

89. The polymer grid triode of claim 38 wherein the conducting organic polymer comprises polyaniline in the conducting, protonated emeraldine salt form.

90. The polymer grid triode of claim 38 wherein the expanded surface area is a surface area greater than 10 $cm^2$/gram and the void space is at least 1% by volume.

91. The polymer grid triode of claim 38 wherein the body is a thin film having a thickness such that the total distance between the first electrode and the second electrode is less than a micron.

92. The polymer grid triode of claim 38 additionally comprising active electronic material between at least one of the first and second electrodes and the polymer grid.

93. The polymer grid triode of claim 38 wherein the active electronic material between the electrodes is a conductor.

94. The polymer grid triode of claim 38 wherein the active electronic material between the electrodes is a semiconductor.

95. The polymer grid triode of claim 38 wherein the active electronic material between the electrodes is an inorganic material.

96. The polymer grid triode of claim 38 wherein the active electronic material between the electrodes is an organic material.

97. The polymer grid triode of claim 95 wherein the active electronic material between the electrodes comprises polyaniline.

98. The polymer grid triode of claim 95 wherein the active electronic material between the electrodes comprises polyaniline in the conductive emeraldine salt form.

99. The polymer grid triode of claim 40 wherein the active electronic material within the voids and the active electronic material between the electrodes are the same.

100. The polymer grid triode of claim 40 wherein the active electronic material within the voids and the active electronic material between the electrodes are different.

101. The polymer grid triode of claim 40 wherein the active electronic material between at least one of the first and second electrodes and the polymer grid comprises semiconducting polyaniline, polyaniline in the conducting protonated emeraldine salt form, semiconducting polypyrrole, or polypyrrole in the oxidized conducting form.

102. The polymer grid triode of claim 40 wherein the active material comprises a conjugated semiconducting organic polymer or a nonconjugated semiconducting organic polymer.

103. The polymer grid triode of claim 102 wherein the active material is selected from the group consisting of poly(paraphenylene vinylene); a soluble derivative of poly(paraphenylene vinylene); poly(thiophene); a soluble derivative of poly(thiophene) and a low molecular weight semiconducting oligomer of thiophene, pyrrole, phenylene, or phenylene vinylene.

104. The polymer grid triode of claim 40 wherein the active electronic material between the electrodes is a conductor.

105. The polymer grid triode of claim 40 wherein the active electronic material between the electrodes is a semiconductor.

106. The polymer grid triode of claim 40 wherein the active electronic material between the electrodes is an inorganic material.

107. The polymer grid triode of claim 40 wherein the active electronic material between the electrodes is an organic material.

108. The polymer grid triode of claim 107 wherein the active electronic material between the electrodes comprises polyaniline.

109. The polymer grid triode of claim 107 wherein the active electronic material between the electrodes comprises polyaniline in the conductive emeraldine salt form.

110. The polymer grid triode of claim 40 wherein active electronic material is present between the first electrode and the polymer grid.

111. The polymer grid triode of claim 110 wherein the active electronic material comprises a semiconducting organic polymer.

112. The polymer grid triode of claim 110 wherein the active electronic material comprises a semiconducting hole transport material.

113. The polymer grid triode of claim 110 wherein the active electronic material comprises PVK.

114. The polymer grid triode of claim 110 wherein the active electronic material is present between the second electrode and the polymer grid.

115. The polymer grid triode of claim 114 wherein the active electronic material within the voids and the active electronic material between the electrodes are the same.

116. The polymer grid triode of claim 114 wherein the active electronic material within the voids and the active electronic material between the electrodes are different.

117. The polymer grid triode of claim 114 wherein the active electronic material between the electrodes comprises a semiconducting electron transport material.

118. The polymer grid triode of claim 114 wherein the active electronic material between the electrodes is part of a bilayer, which bilayer comprises a layer of active electronic material and a second polymer grid comprising a second body of electrically conducting organic polymer, said second body having an open and porous network morphology and defining an expanded surface area void-defining porous network and active electronic material located within at least a portion of the void spaces defined by the porous network the active electronic material in the voids of the second body being different from the active electronic material between the electrodes.

119. The polymer grid triode of claim 118 wherein the active electronic material within the voids of the second body comprises a semiconducting material.

* * * * *